US008310370B1

(12) United States Patent
Williams, Jr. et al.

(10) Patent No.: US 8,310,370 B1
(45) Date of Patent: Nov. 13, 2012

(54) SMART CIRCUIT BREAKER WITH INTEGRATED ENERGY MANAGEMENT INTERFACE

(75) Inventors: Olin A. Williams, Jr., Lawrenceville, GA (US); Arnold C. Solomon, Covington, GA (US)

(73) Assignee: Southern Company Services, Inc., Atlanta, GA (US)

( * ) Notice: Subject to any disclaimer, the term of this patent is extended or adjusted under 35 U.S.C. 154(b) by 423 days.

(21) Appl. No.: 12/645,839

(22) Filed: Dec. 23, 2009

(51) Int. Cl.
*G08B 21/00* (2006.01)
*G01R 21/00* (2006.01)

(52) U.S. Cl. ............... 340/636.18; 340/636.12; 340/635; 702/57; 702/61

(58) Field of Classification Search .................. 340/635, 340/636.12–636.18, 643, 646, 650, 651, 340/652, 657, 660, 661, 664; 361/42, 93.2, 361/96, 103; 324/424, 684, 685, 713; 702/51, 702/67, 57, 61
See application file for complete search history.

(56) References Cited

U.S. PATENT DOCUMENTS

| | | | | |
|---|---|---|---|---|
| 5,627,716 A | * | 5/1997 | Lagree et al. | 361/93.2 |
| 6,031,703 A | * | 2/2000 | Serpinet et al. | 361/103 |
| 7,057,401 B2 | * | 6/2006 | Blades | 324/713 |
| 7,099,785 B2 | * | 8/2006 | Lee et al. | 702/57 |
| 7,193,827 B2 | * | 3/2007 | Reid et al. | 361/42 |
| 7,251,570 B2 | * | 7/2007 | Hancock et al. | 702/57 |
| 7,805,262 B2 | * | 9/2010 | Slater et al. | 702/61 |
| 7,907,062 B2 | * | 3/2011 | Feliss et al. | 340/693.6 |
| 2010/0145542 A1 | * | 6/2010 | Chapel et al. | 700/295 |

* cited by examiner

*Primary Examiner* — Van T. Trieu
(74) *Attorney, Agent, or Firm* — Womble Carlyle Sandridge & Rice, LLP; John J. Timar

(57) ABSTRACT

A method, system, and apparatus for monitoring electrical safety conditions and managing energy consumption using a microcontroller embedded in a circuit breaker. The microcontroller receives a plurality of inputs detected by a plurality of sensors in the circuit breaker. An amount of energy consumed during a preset interval of time is determined. A temperature of a circuit breaker panel board detected by a temperature sensor is received and compared with a preset temperature alarm threshold value to determine a panel board overheating condition. A condition of the neutral conductor is determined based on a plurality of line voltages and currents received from a plurality of voltage and current sensors by comparing a voltage differential with a preset threshold differential voltage value. A plurality of data values derived from the plurality of sensor inputs and indicative of electrical safety conditions and energy consumption is transmitted via a secure communications link to a data processing system for translation, storage, and presentation to an energy consumer.

42 Claims, 34 Drawing Sheets

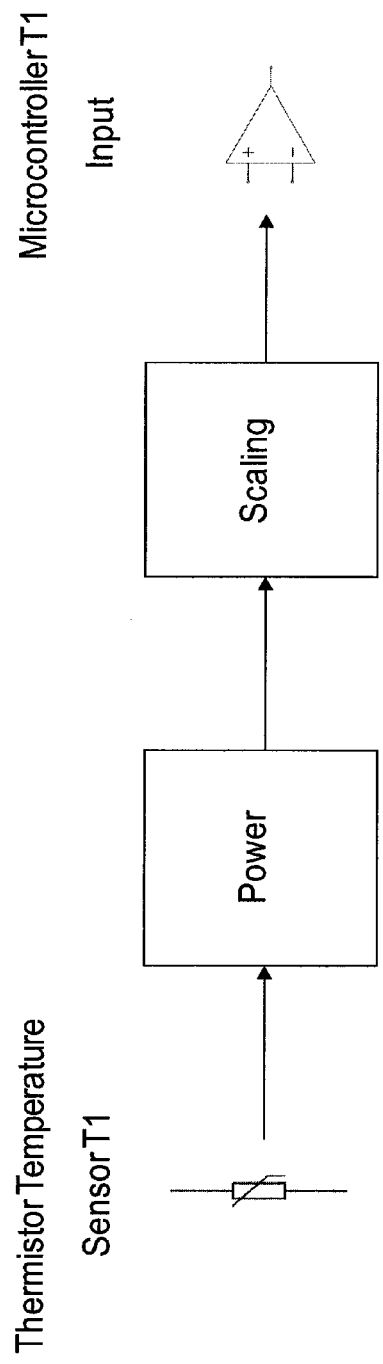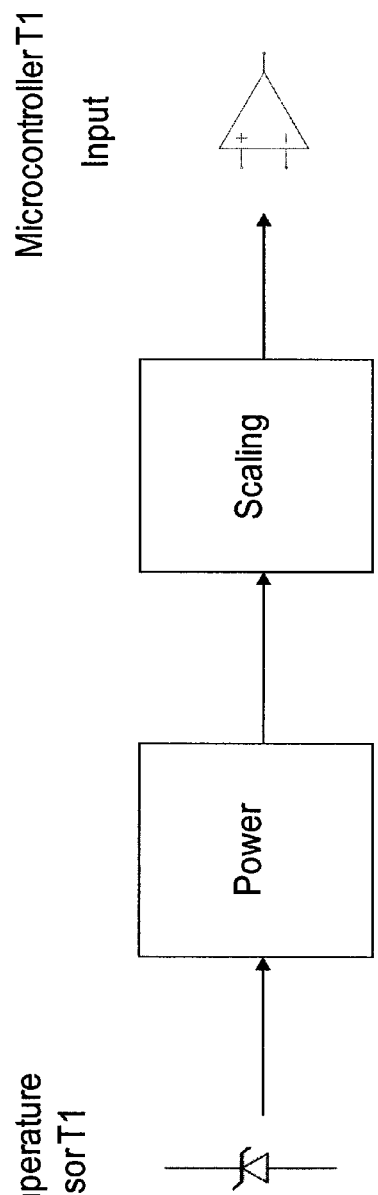

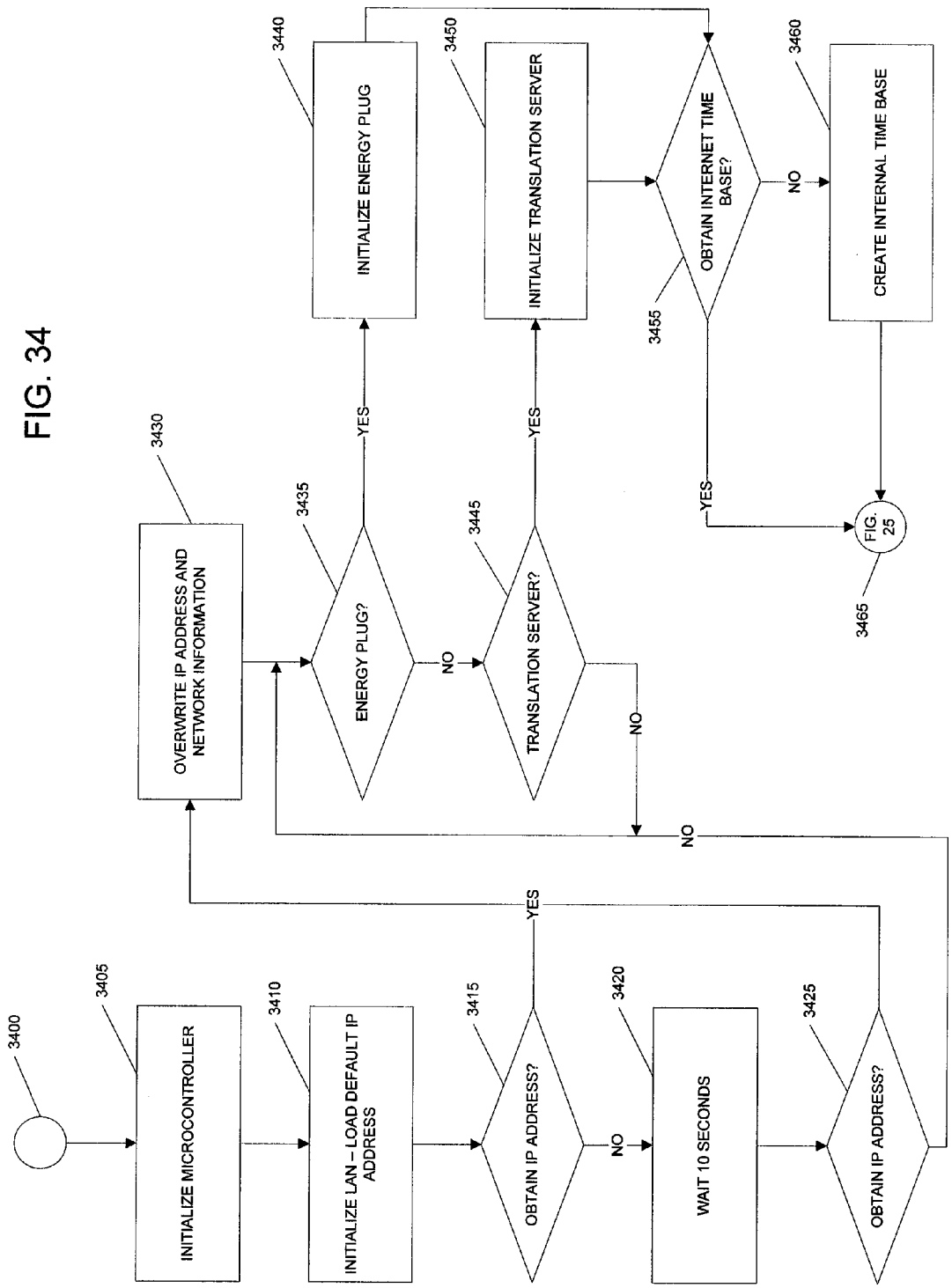

SMART CIRCUIT BREAKER WITH INTEGRATED ENERGY MANAGEMENT INTERFACE

TECHNICAL FIELD

Embodiments of the invention relate generally to circuits used in electrical power sensing systems and, more particularly, to smart circuit breakers for monitoring electrical safety conditions and energy management.

BACKGROUND OF THE INVENTION

One of the factors that limit an energy consumer's ability to manage the electrical load is the lack of access to the energy consumer's real-time power consumption. Although voltage and current sensors can be added to an electrical panel board with discrete sensors, this addition is generally beyond the capability of the average energy user, and generally does not comply with the National Electrical Code (NEC) as adopted by most jurisdictions. This lack of real-time data impedes the energy consumer's ability to leverage energy management programs that are available on the Web or on local area network (LAN) connected devices. Two such Web-based services for tracking energy consumption are Google PowerMeter and Microsoft Hohm.

SUMMARY OF THE INVENTION

The embodiments of the disclosure provide a drop-in replacement for circuit breakers that contains a microprocessor with sensors, a data acquisition and computational element, a communications element, and a presentation element, all in one easy to install molded case. The drop-in replacement can be for the main circuit breaker or any combination of branch circuit breakers. The National Electrical Code's provision for "Classified Circuit Breakers," commonly referred to as interchangeable breakers, provides for other manufactures participation in the electrical panel board space.

In exemplary embodiments, voltage, current, and temperature sensors are added to the circuit breaker assembly along with four logical software elements. The software elements include: (1) data acquisition and computational element; (2) formatting and presentation software; (3) central control element, operating system, and application software; and (4) communication element and driver software. The data acquisition and computational element can store and format the sensor data. The presentation element, at a minimum, can contain both a Web server for easy configuration and reading and a Secure Shell (SSH) protocol daemon for machine to machine communications with other LAN or wide area network (WAN) connected devices. The central control element executes the operating system code and the application code for the (1) watt-hour measuring software; (2) deteriorating neutral conductor detection software; (3) deteriorating ground system detection software; and (4) circuit breaker panel overheating detection software. In addition, the central control element should also include a File Transfer Protocol (FTP) server for firmware updating (i.e., modification) as well as an interface for initial module programming and recovery. The ability to re-flash the software insures compatibility with future energy management services and programs. The communications element allows the data to be transmitted to a web based translation service, to a personal computer, or to an embedded monitor/controller (Energy Plug) via a communications link. This communications element provides a link that could use, but is not limited to, any of the following protocols and technologies: IEEE 802.11a/b/g/n, Bluetooth, HomePlug, Broadband over Power Line (BPL), Power Line Carrier (PLC), Worldwide Interoperability for Microwave Access (WiMAX), ZigBee®, or fiber optic technology in order to meet market demands and customer preferences. A Network Time Protocol (NTP) routine also can be incorporated so that data points can be time stamped to correlate with Time of Use (TOU) rates.

In an exemplary embodiment, a method is provided for monitoring and managing energy consumption using a microcontroller embedded in a circuit breaker. The microcontroller receives a plurality of inputs detected by a plurality of sensors in the circuit breaker. An amount of energy consumed during a preset interval of time is determined. A temperature of a circuit breaker panel board detected by a temperature sensor is received and compared with a preset temperature alarm threshold value to determine a panel board overheating condition. A condition of the neutral conductor is determined based on a plurality of line voltages and currents received from a plurality of voltage and current sensors by comparing a voltage differential with a preset threshold differential voltage value. A plurality of data values derived from the plurality of sensor inputs and indicative of electrical safety conditions and energy consumption is transmitted via a secure communications link to a data processing system for storage and presentation to an energy consumer.

In an exemplary embodiment, a smart circuit breaker is provided for an electrical circuit. The circuit breaker has an embedded microcontroller, with firmware stored in a memory, for determining a plurality of energy consumption and safety conditions for the electrical circuit. A temperature sensor detects a temperature associated with the circuit breaker panel board and inputs the temperature to the microcontroller for determination of a circuit breaker panel overheating condition. A plurality of voltage sensors detects a voltage associated with each of a plurality of conductors in the circuit breaker and inputs the plurality of voltages to the microcontroller for determination of a neutral conductor deterioration condition. A plurality of current sensors detects a current flow through each of the plurality of conductors, and inputs the plurality of current flows to the microcontroller for determination of a leakage current condition. A network interface communicates a plurality of data values indicative of the energy consumption and safety conditions determined by the firmware stored in the microcontroller from the sensor temperature, voltage, and current inputs to a data processing system over a communications network. The data processing system can include a translation server for receiving the data values and reformatting the data values for presentation to a consumer via an energy management service.

BRIEF DESCRIPTION OF THE DRAWINGS

These and other advantages and aspects of the embodiments of the disclosure will become apparent and more readily appreciated from the following detailed description of the embodiments taken in conjunction with the accompanying drawings, as follows.

FIGS. 6A-6B illustrate two temperature sensor circuits for a Smart Circuit Breaker in exemplary embodiments.

FIG. 34 illustrates processing logic for a microcontroller startup process for a Smart Circuit Breaker in an exemplary embodiment.

DETAILED DESCRIPTION

Figure 1:
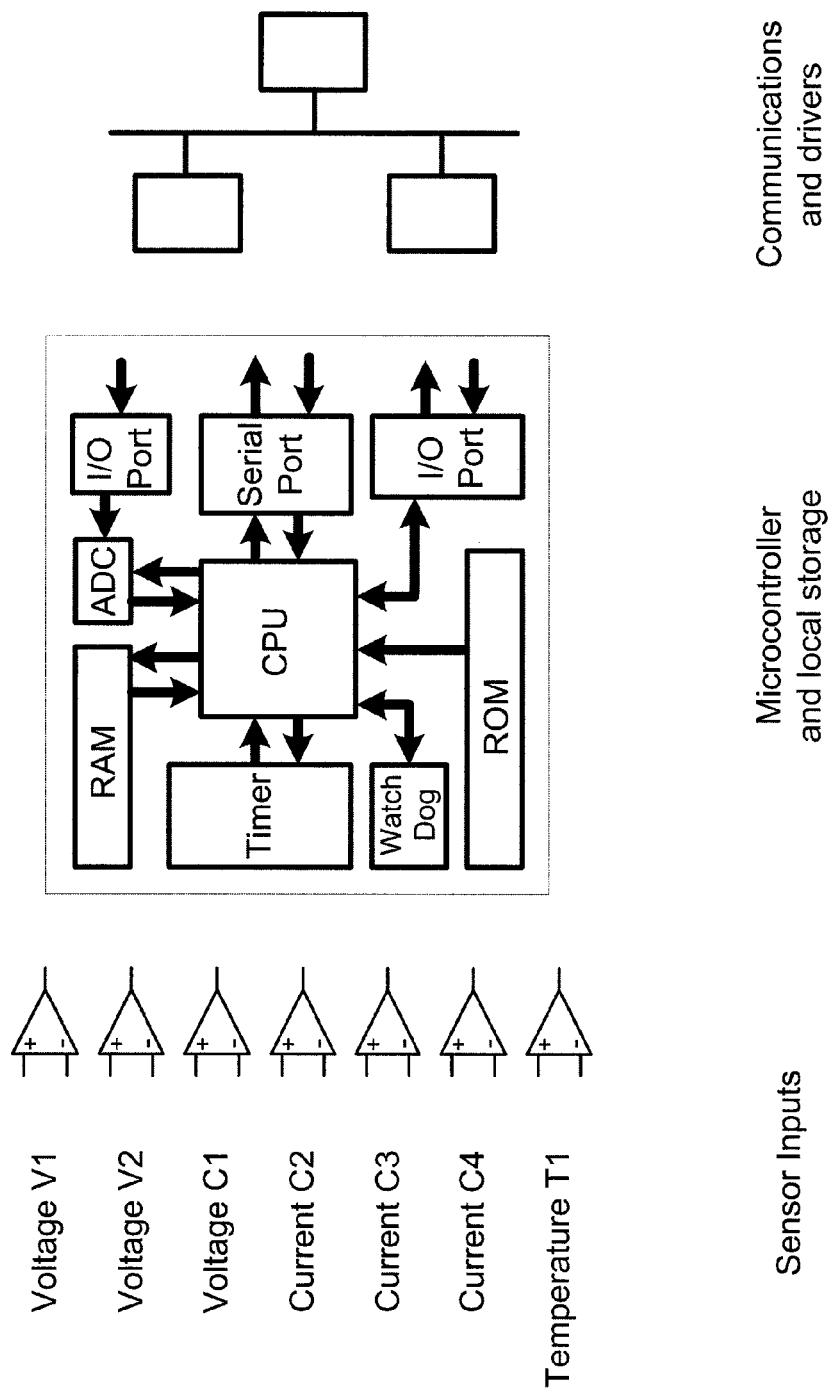
FIG. 1 illustrates a base electronic circuit diagram for a Smart Circuit Breaker single phase system in an exemplary embodiment.

The following description is provided as an enabling teaching of embodiments of the invention including the best, currently known embodiment. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances. Thus, the following description is provided as illustrative of the principles of the embodiments of the invention and not in limitation thereof, since the scope of the invention is defined by the claims.

In exemplary embodiments, the Smart Circuit Breaker electronic circuit includes the following functionality: (1) internal potential transformers and voltage measuring circuits; (2) internal current transformers and current measuring circuits; (3) external current sensors and current measuring circuits; (4) internal temperature sensor and temperature measuring circuits; (5) internal microprocessor control with watch dog timer; (6) flexible options for communications with ancillary equipment; (7) TCP/IP communications stack; (8) boot and recovery firmware; (9) watt-hour measuring software; (10) deteriorating neutral conductor detection software; (11) deteriorating ground system detection software; (12) circuit breaker panel overheating detection software; and (13) phase loss detection software (three phase system).

Before describing the embodiments in detail, the following paragraphs provide an overview of the unique features found in the various embodiments. These features include the addition to the circuit breaker of a temperature sensor, a differential current sensor, and voltage sensors to the circuit breaker panel, along with a microcontroller and software routines to monitor panel temperature, neutral conductor deterioration, leakage current, ground system deterioration, and phase loss sensing (for three phase systems).

Circuit Breaker Panel Temperature Monitoring Functionality

A significant improvement to the current state of the art is in the addition of a temperature sensor to the circuit breaker assembly. This addition of a sensor to the assembly raises the level of consumer protection, as now internal panel board heating can be detected and reported. Excessive heating generally precedes component failures in panel boards. This early detection can reduce catastrophic failures in panel board systems and the untimely service interruptions that follow them. If the temperature detected by the sensor exceeds a threshold value, an alarm signal can be generated to notify the consumer of an overheating condition.

Neutral Conductor Deterioration Sensing Functionality

A significant improvement to the current state of the art is in the addition of software subroutines to analyze the readings from the voltage and current sensors to detect a deteriorating neutral conductor. Currently, this condition is diagnosed only by electricians and power company employees after equipment damage is experienced by the consumer. Now, the consumer can be warned of this evolving, potentially dangerous situation for correction before damage takes place. The National Electrical Code specifies a maximum feeder drop of 2% for electrical systems. Based on this recommendation, for a live conductor having a voltage of 120 VAC, the maximum feeder drop is 2.4 VAC. For two live conductors, the maximum feeder drop is 4.8 VAC which is rounded to 5 VAC. The voltage differential between the two line voltages can be compared to a threshold value of 5 VAC in exemplary embodiments to determine the existence of a deteriorating neutral condition.

Leakage Current Sensing Functionality

A significant improvement to the current state of the art is in the addition of a differential current sensor to the circuit breaker assembly. Unlike a Ground Fault Circuit Interrupter (GFCI), electrical service is not automatically interrupted to the consumer. Instead, the consumer is warned of this evolving, potentially dangerous situation for correction. This condition could be caused by water intrusion into a dishwasher, clothes washer, sump pump, or insulation damage to inside wiring, often times caused by rodents. An advance warning allows the consumer to investigate and correct the condition prior to an accident or catastrophic failure. The trip range for a GFCI branch circuit breaker is 4 to 6 milliamperes. A differential current flow that exceeds a threshold value of 6 milliamperes is used in exemplary embodiments to determine a leakage current condition.

Ground System Deterioration Sensing Functionality

A significant improvement to the current state of the art is in the addition of circuitry to monitor the building ground system in relation to the system neutral conductor. Through an additional software subroutine, the results from the deteriorating neutral test can be processed with the neutral and ground current sensors to determine the building system's ground condition. The consumer can be warned of this evolving, dangerous situation for correction before the building users start to receive small electrical shocks. For a ground rod resistance of 25 ohms or less (National Electric Code) and a maximum feeder drop of 2%, and 200 amperes current flow in the neutral circuit conductor, the corresponding current loss is 2.4 VAC/25 ohms=96 mA. The ratio of current loss of 96 mA to the current flow in the neutral conductor of 200 amperes is 1:2084. The ratio 1:2000 is used as a threshold value in exemplary embodiments to determine a deteriorating ground condition as described herein. A current ratio less than 1:2000 represents an alarm condition when current is present in the neutral conductor.

Phase Loss Sensing Functionality

For commercial and industrial customers with three phase electrical services, a significant improvement to the current state of the art is in the addition of a software subroutine to analyze the readings from the three voltage and three current sensors to detect a loss of phase. Phase loss can lead to overheating of motors and premature failure. Process heating equipment can fail to achieve the required temperature for a process while computing equipment can be damaged by this condition. The Smart Circuit Breaker can detect this condition and can pass a message over the LAN to the appropriate building and process automation systems for shutting the systems down to prevent damage. Computer systems can easily receive this message over a LAN enabling them to perform an orderly shut down thus preventing data loss and/or corruption while averting electrical damage.

Energy Management Portal Web Service

Access by the customer to the energy management information is available from various locations via the Web. The consumer can utilize various Web-based energy consumption monitoring services such as Google PowerMeter, Microsoft Hohm, and similar presentation and monitoring services.

Translation Service

The Web Translation Service enhances the value of the smart circuit breakers by data translation, long term storage, centralized configuration and software management. The Web Translation Service is novel in that it allows the consumer to easily set up connectors to various Web based services such as Google PowerMeter, Microsoft Hohm, or similar presentation and monitoring services. The raw data remains with the consumer on the Web Translation Service so that as various energy management vendors enter the market space, the consumer can connect their historical data into the service preventing the loss of data that customarily follows service provider changeovers.

Data format translation is handled by the Web Translation Service alleviating the need to update the firmware on the Smart Circuit Breaker on a regular basis or upon presentation service provider change. The Web Translation Service also is unique in that it can be configured to allow a consumer to utilize more than one Energy Management Portal Web Service. The Translation Server emulates a utility company's Automated Metering Infrastructure (AMI) gateway or individual consumer owned monitoring devices depending on the required configuration.

Figure 13:
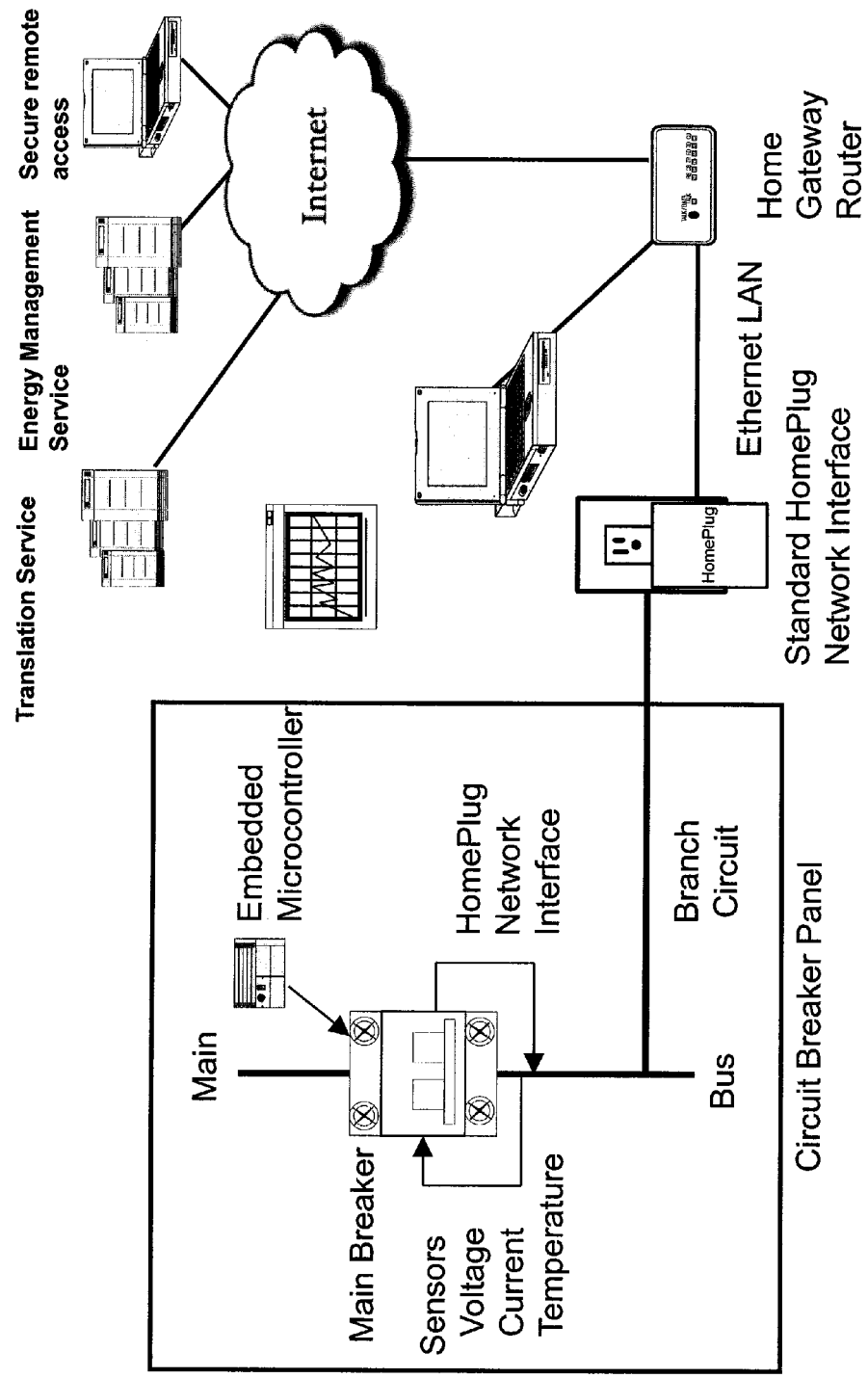
FIG. 13 illustrates a Smart Circuit Breaker system diagram providing web storage of energy management information in an exemplary embodiment.

FIG. 13 represents a typical configuration of a system that utilizes both a web-based energy application and web-based storage. The energy consumption and safety data originates from the Smart Circuit breaker installed in the consumer's circuit breaker panel. When coarse resolution is desired, only the main breaker or breakers are replaced by Smart Breakers. When finer resolution is desired, one or more branch circuit breakers are replaced with Smart Breakers. The Smart Breakers then transmit both consumption and safety data via a transport medium. The data transport medium may include, but is not limited to, one of the following transport technologies, IEEE 802.11a/b/g/n, Bluetooth, HomePlug, BPL, PLC, WiMAX, ZigBee®, or fiber optic line driver system. Ultimately regardless of the transport technology utilized in the customer's premises, the data exits the customer's premises via a broadband access router as a standard TCP/IP message directed toward the network-based Translation Service server. The Translation Server performs the required data format conversion based on the customer's account information stored in a customer information database at the Translation Server. Based on the customer's account preference, the newly reformatted data can be sent to one or more web based Energy Management Services, such as Google PowerMeter and Microsoft Hohm for presentation to the customer. Also based on the customer's account preference the Translation Server can receive and process an alarm (safety message) and format it for presentation by the Energy Management Service server for presentation to the customer. If the Energy Management Service doesn't provide for alarm display, the Translation Server can alert the consumer of the alarm condition by many methods. The methods can include, but are not limited to, electronic mail, Short Message Service (SMS), numeric paging, and text paging. The customer can view his consumption via a web based portal provided by the customer's Energy Management Service provider. Access to the energy management service is by secure remote access from a personal computer, laptop, or other suitable electronic communications device.

In FIG. 13 the Smart Circuit breaker panel is shown connected to mains and includes an embedded microcontroller; voltage, current, and temperature sensors; and a Home Plug network interface. An electrical bus connects a branch circuit to an electrical outlet at which a standard Home Plug network interface adapter is attached. The network interface adapter can be connected to the home gateway router via an Ethernet cable. The laptop connected to the router enables the consumer to monitor energy consumption in the home. The web-based energy management server is the source of the data presentation.

Energy Plug

Energy Plug is a local area network (LAN)-based appliance that can provide three optional functions to the Smart Circuit Breaker system. If data privacy is desired, Energy Plug can be configured to provide local storage on standard USB hard drives and solid state memory devices. If the ultimate in privacy is desired, the Energy Plug can host the Energy Management portal typically implemented as a Web-based service on the Internet. The last optional function of the Energy Plug is to host a Web server with Secure Sockets Layer (SSL) support (https). This functionality allows remote users to authenticate and communicate with their LAN-based energy management portal from the Internet (WAN). If remote control of electrical devices is required, optional software can be added to the Energy Plug that will allow it to function as a control gateway with existing secure techniques. The Energy Plug energy management control function is provided through both branch circuit breakers incorporating solid state relays and through point of use low voltage control modules on central air conditioning systems. When energy control is incorporated into a product, security concerns become heightened. Not only does the Energy Plug module utilize standard cryptographic techniques such as SSL to protect the communications session over external networks, but each control device incorporates a positive control function. This positive control function may take the form of, but is not limited to, any of the following:

1. an electromechanical enable/disable switch;
2. a push/pull operator;
3. a rotary operator;
4. a removable pin operator.

The positive control function is independent of any software on the controlled end user device and provides a distinctive colored warning indication when enabled. The positive control function ensures that the consumer makes a conscious informed decision when enabling control of an end user device. The switch function also allows a granular level of control, also independent of software.

Figure 14:
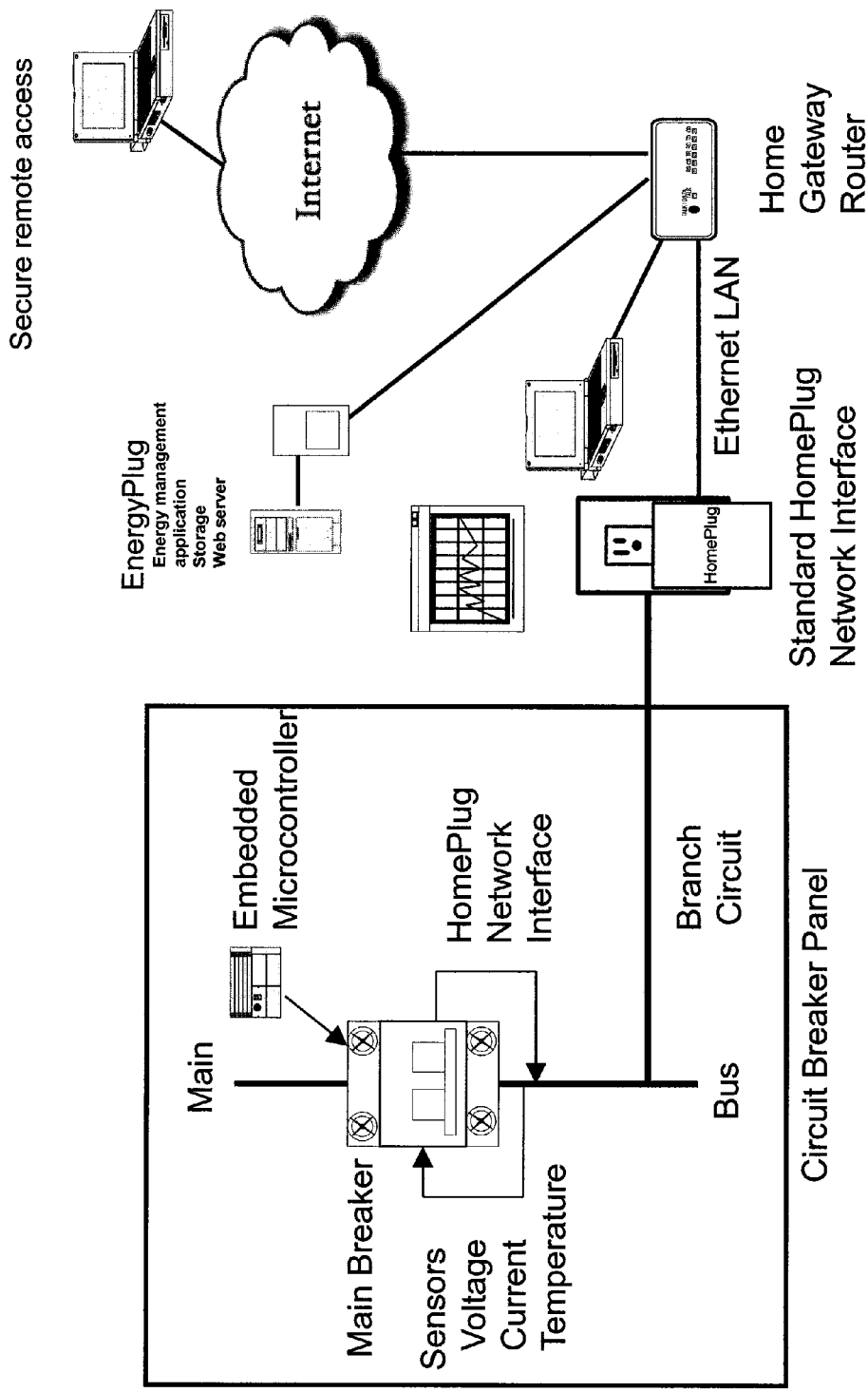
FIG. 14 illustrates a Smart Circuit Breaker system diagram providing local storage of energy management information in an exemplary embodiment.

FIG. 14 represents a typical configuration of a system that utilizes local computing resources within the EnergyPlug. The EnergyPlug also hosts the energy management application, and a web server for energy consumption and alarm presentation. A third major function is managing local storage for historical energy consumption retention. The energy consumption and safety data originates from the Smart Circuit breaker installed in the consumer's circuit breaker panel. When coarse resolution is desired, only the main breaker or breakers are replaced by Smart Breakers. When finer resolution is desired, one or more branch circuit breakers are replaced with Smart Breakers. The Smart Breakers then transmit both consumption and safety data via a transport media. The data transport media may include, but is not limited to, one of the following transport technologies, IEEE 802.11a/b/g/n, Bluetooth, HomePlug, BPL, PLC, WiMAX, ZigBee®, or fiber optic line driver system. Ultimately, regardless of the transport technology utilized in the customer's premises, the data is routed via TCP/IP messages to the EnergyPlug on the customer's LAN. The EnergyPlug hosts the Energy Management Service application as well as the Alarm Notification Service application. Web pages on the Energy Plug server are updated with the current alarm status for presentation to the customer. The EnergyPlug server may be configured to alert the consumer of the alarm condition by many methods. The methods can include, but are not limited to, electronic mail, Short Message Service (SMS), numeric paging, and text paging. The customer may view his consumption via a web server also hosted on the Energy Plug server.

The Smart Circuit breaker panel shown in FIG. 14 is identical to that shown in FIG. 13 and shows the smart breaker connected to mains and including an embedded microcontroller; voltage, current, and temperature sensors; and a home plug network interface. An electrical bus connects a branch circuit to an electrical outlet at which a standard home plug network interface is attached. The network interface adapter can be connected to the home gateway router via an Ethernet cable. The laptop connected to the router enables the consumer to monitor energy consumption in the home. The Energy Plug is shown connected to the router and includes a local energy management application with energy management data stored locally on a Web server that can be provided to the user via a secure remote access from a personal computer, laptop, or other suitable electronic communications device.

Smart Circuit Breaker Microcontroller

Figure 15:
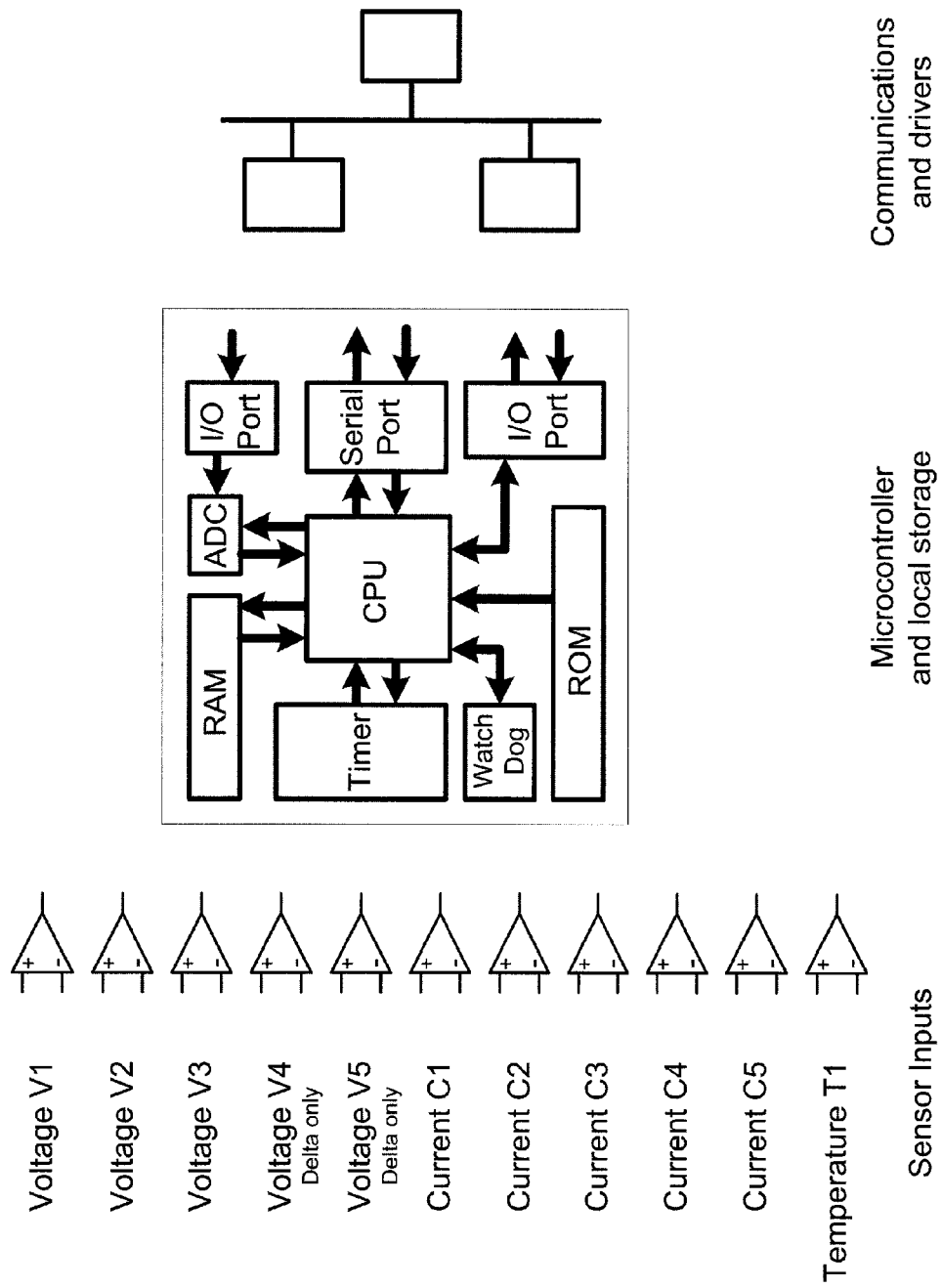
FIG. 15 illustrates a base electronic circuit diagram for a Smart Circuit Breaker in a three phase system in an exemplary embodiment.

As illustrated in FIG. 1 for single phase systems and in FIG. 15 for three phase systems, the Smart Circuit Breaker electronic circuit board includes a plurality of sensor inputs, a microcontroller and local storage, and communications and drivers. The microcontroller and local storage typically includes a microprocessor with random access memory (RAM), read only memory (ROM), non-volatile EEROM, I/O, real time clock, watchdog timer and a basic system timing source. The ROM contains the initial boot and recovery code. The non-volatile EEROM contains the operating system, applications, drivers, utilities, and customer specific values configured by the user. The calibration of the sensors is performed by software with the calibrating values stored in non-volatile EEROM address by the microcontroller. EEROM is an acronym for electrically erasable read-only memory.

Figure 2:
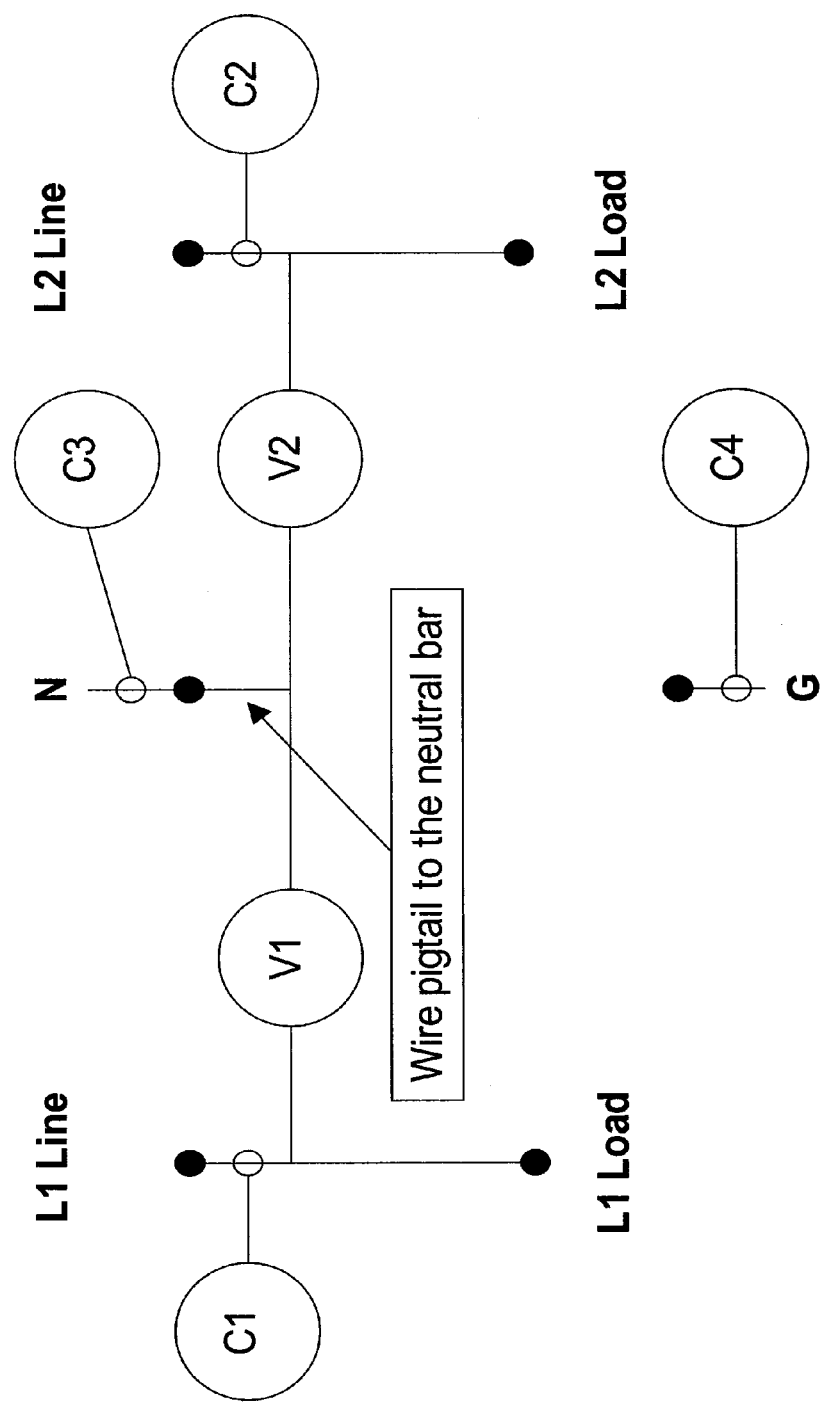
FIG. 2 illustrates a base electrical circuit diagram for a Smart Circuit Breaker single phase system in an exemplary embodiment.

The communications and drivers represents transport technologies including, but not limited to: IEEE 802.11a/b/g/n, Bluetooth, HomePlug, BPL, PLC, WiMax, ZigBee®, or fiber optic line driver system. The TCP/IP communications stack will always be present in the device to communicate with LAN and optionally WAN based services. The block diagram for the base electrical circuit of the Smart Circuit Breaker single phase system is illustrated in FIG. 2.

The startup process of the microcontroller of the Smart Circuit Breaker is shown in FIG. 34. The microcontroller powers on in block 3400, and is initialized in block 3405. The local area network is initialized and the default IP address is loaded in block 3410. The microcontroller searches for an IP address in decision block 3415 and, if it does not obtain the IP address after a wait of 10 seconds as indicated in block 3420, the microcontroller will try again in decision block 3425. If the IP address is obtained in decision blocks 3415 or 3425, IP address and network information will be overwritten, as indicated in block 3430, with the values obtained from the network Dynamic Host Configuration Protocol (DHCP) server. Next, the microcontroller determines its relationship to an Energy Plug in decision block 3435 or Translation Server in decision block 3445. Either the Energy Plug will be initialized in block 3440, or the translation server will be initialized in block 3450. If neither device is detected, the program loops on these steps until either an Energy Plug or a Translation Server is detected. Next, in decision block 3455, a determination is made if the Internet time base has been obtained. If the Internet time base has been obtained, the system loop is then entered as indicated in connector block 3465. If the Internet time base has not been obtained, an internal time base is generated as shown in block 3460 before entering the system loop.

Figure 25:
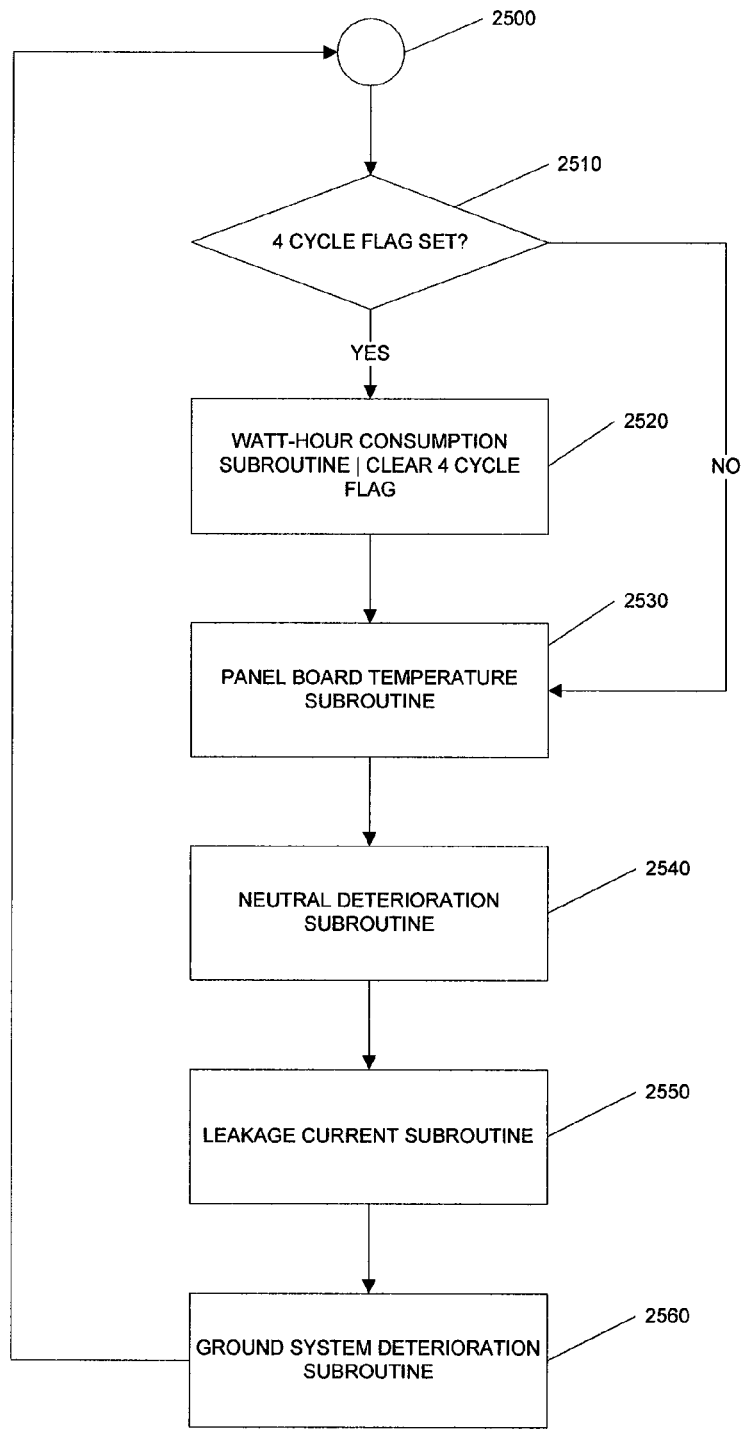
FIG. 25 illustrates system loop processing logic for the Smart Circuit Breaker in both single and three phase systems in an exemplary embodiment.

Once the microcontroller has determined its network configuration and its relationship to either an EnergyPlug or WAN-based Translation Server, the microcontroller enters the system loop process as illustrated in the processing logic of FIG. 25. The system loop process is the same for both single phase and three phase systems. The system loop starts in connector 2500. In decision block 2510, a determination is made if the four cycle flag is set. If the four cycle flag is not set, the system loop process continues in block 2530. If the four cycle flag is set, the watt-hour consumption routine is performed, as indicated in block 2520. Upon completing the watt-hour consumption routine, the 4 cycle flag is cleared before proceeding to the panel board temperature routine in block 2530. The panel board temperature routine is followed by the neutral deterioration routine as shown in block 2540. The leakage current routine is performed as indicated in block 2550. The ground system deterioration routine is performed as indicated in block 2560. The process then returns to the start of the system loop routine.

Single Phase Systems

Residential and light commercial electrical systems use a single-phase, split-leg three wire circuit nominally delivering 120 VAC and 240 VAC for use by household equipment and appliances. The three wire electrical circuit includes a neutral conductor (N) and first and second live conductors (L1, L2).

The block diagram for the single phase base electronic circuit board that controls the energy monitoring function of the Smart Circuit Breaker is illustrated in FIG. 1. The circuit includes voltage sensor inputs V1 and V2, current sensor inputs C1, C2, C3, and C4, and temperature sensor input T1. Current sensors C1, C2 and voltage sensors V1, V2 are internal to the Smart Circuit Breaker. Sensors C3, C4 are cord connected clamp on Hall Effect current sensors.

Figure 3:
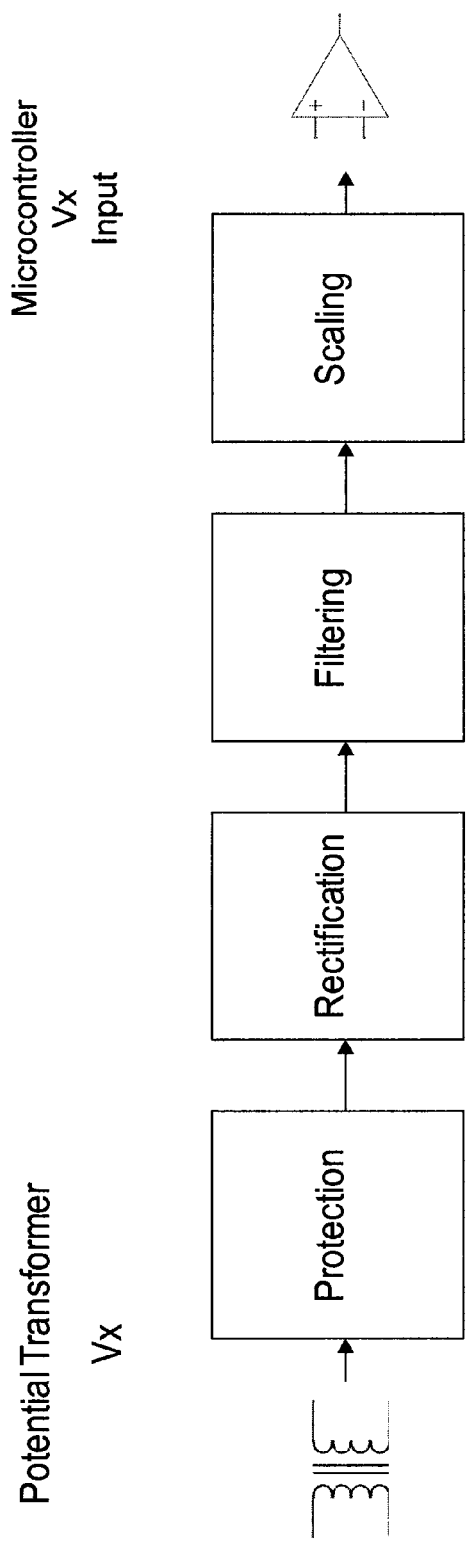
FIG. 3 illustrates a voltage input circuit for a Smart Circuit Breaker in an exemplary embodiment.

The sensor inputs, V1, V2 represent input channels to the electronic circuit board. FIG. 3 shows that the voltage inputs are potential transformers housed in the molded circuit breaker assembly. The potential transformers feed an onboard protection circuit followed by rectification, filtering, and scaling, prior to entering the digital logic system via an analog to digital converter typically designated Vx Input. The protection circuit seeks to prevent damage to the Smart Circuit Breaker from voltage spikes and transients normally encountered in an electrical environment. The rectification circuit converts the AC voltage from the potential transformer to a DC voltage for further processing. The filtering circuit, in conjunction with the scaling circuit, provides a DC output voltage in proportion to the root mean square alternating current (RMS AC) voltage initially presented to the analog to digital converter input channel designated as Vx.

Figure 4:
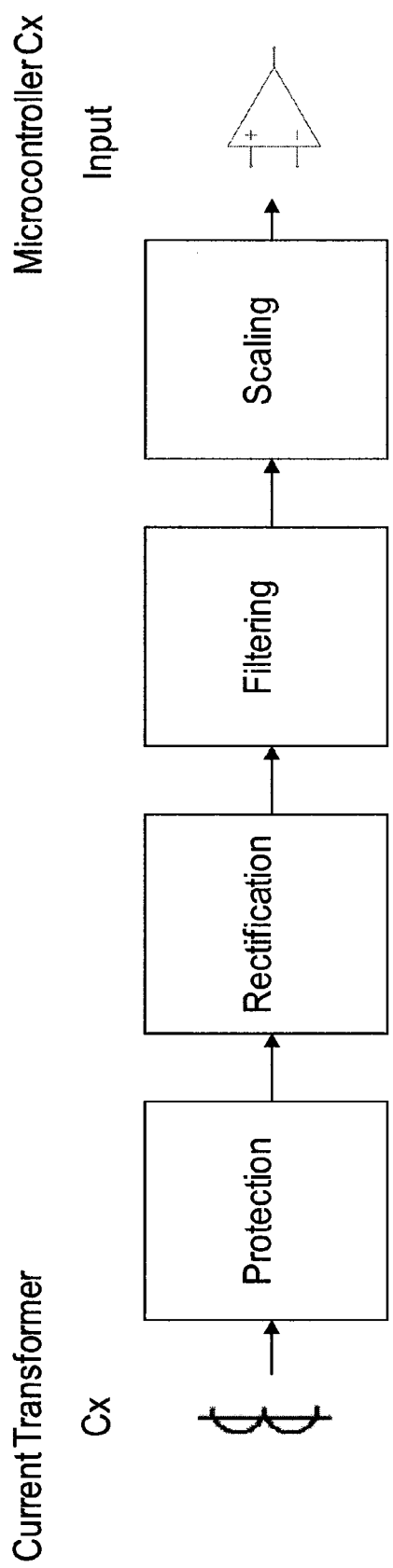
FIG. 4 illustrates a current transformer sensor circuit for a Smart Circuit Breaker in an exemplary embodiment.

The sensor inputs, C1 and C2 represent input channels to the electronic circuit board. FIG. 4 shows that the current inputs are current transformers (e.g., toroid-based) housed in the molded circuit breaker assembly. The current transformers feed an onboard protection circuit followed by rectification, filtering, and scaling, prior to entering the digital logic system via an analog to digital converter typically designated Cx input. The protection circuit seeks to prevent damage to the Smart Circuit Breaker from voltage spikes and transients normally encountered in an electrical environment. The rectification circuit converts the AC voltage from the current transformer to a DC voltage for further processing. The filtering circuit, in conjunction with the scaling circuit, provides a DC output voltage in proportion to the RMS AC current initially presented to the analog to digital converter input channel designated as Cx.

Figure 5:
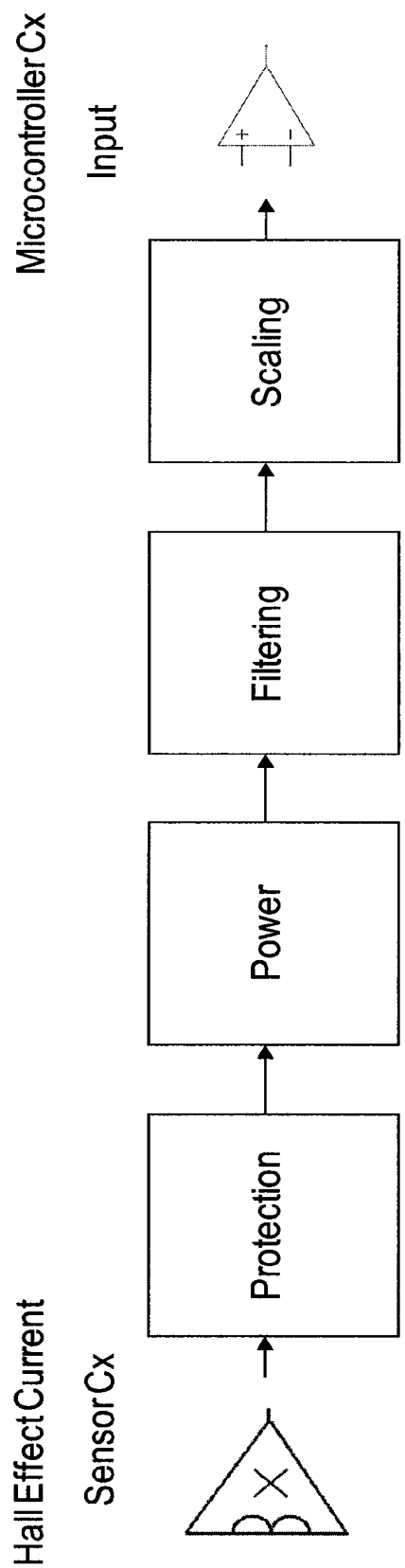
FIG. 5 illustrates a Hall Effect current sensor circuit for a Smart Circuit Breaker in an exemplary embodiment.

The sensor inputs, C3 and C4 represent input channels to the electronic circuit board. Current sensors C3 and C4 are Hall Effect solid state devices that are strapped to the neutral circuit conductor and the ground circuit conductor. FIG. 5 shows that the current inputs are Hall Effect current sensors connected to the molded Smart Circuit Breaker by keyed plug and cord assemblies. The Hall Effect current sensors feed an onboard protection circuit followed by rectification, filtering, and scaling, prior to entering the digital logic system via an analog to digital converter typically designated Cx Input. The protection circuit seeks to prevent damage to the Smart Circuit Breaker from voltage spikes and transients normally encountered in an electrical environment. The rectification circuit removes the AC component present on the DC biased output of the Hall Effect current sensor and presents it as a DC voltage for further processing. The filtering circuit, in conjunction with the scaling circuit, provides a DC output voltage in proportion to the RMS AC current initially presented to the analog to digital converter input channel designated as Cx.

The sensor input T1 represents an input channel to the electronic circuit board. Temperature sensor T1 is shown in greater detail in FIGS. 6A-6B which show that the temperature input may be either a thermistor or an integrated circuit temperature measuring circuit. The temperature measuring component is not limited to just thermistors and monolithic integrated temperature monitoring integrated circuits, but may utilize other technologies to perform the temperature monitoring function as the designer sees fit. The temperature sensor is housed in the molded circuit breaker assembly behind a grill or duct that allows adequate airflow so that the ambient temperature of the circuit breaker box may be accurately gauged. The temperature sensor is powered from the power control circuit and the value is passed to the scaling circuit before being presented to the analog to digital converter input channel designated T1.

Figure 7:
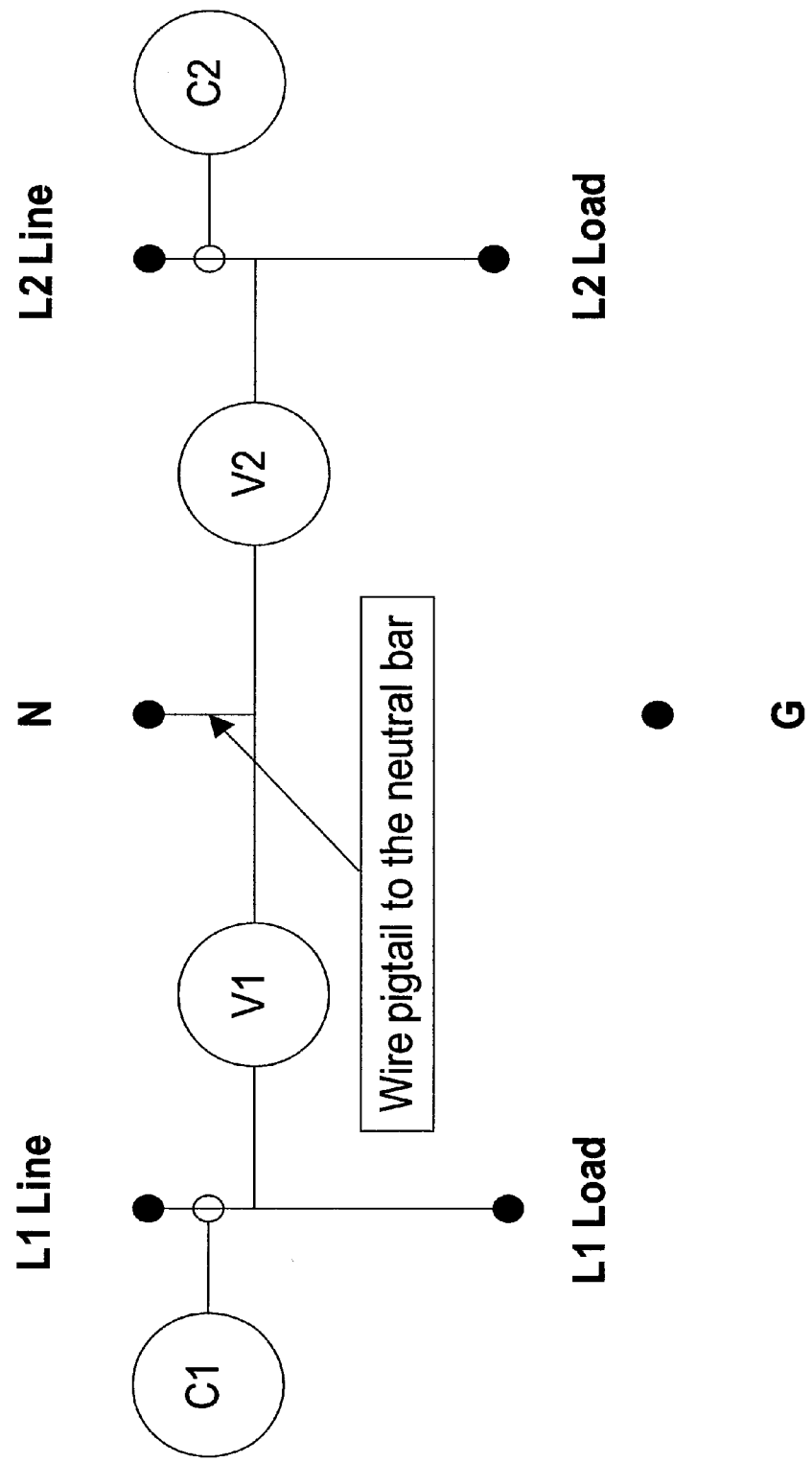
FIG. 7 illustrates the sensors used to determine the wattage consumed using a Smart Circuit Breaker single phase system in an exemplary embodiment.

To accomplish the energy monitoring function for single phase systems, the microprocessor utilizes voltage sensors V1, V2 in conjunction with current sensors C1, C2 to determine the wattage consumed as illustrated in FIG. 7. The base electronic system, as illustrated in FIG. 1, determines the consumption and formats the data for transmission to either the Translation Server or the Energy Plug for accumulation and presentation to the consumer. The base electronic system derives its timing from the 60 Hz power line as show in FIG. 16.

Figure 16:
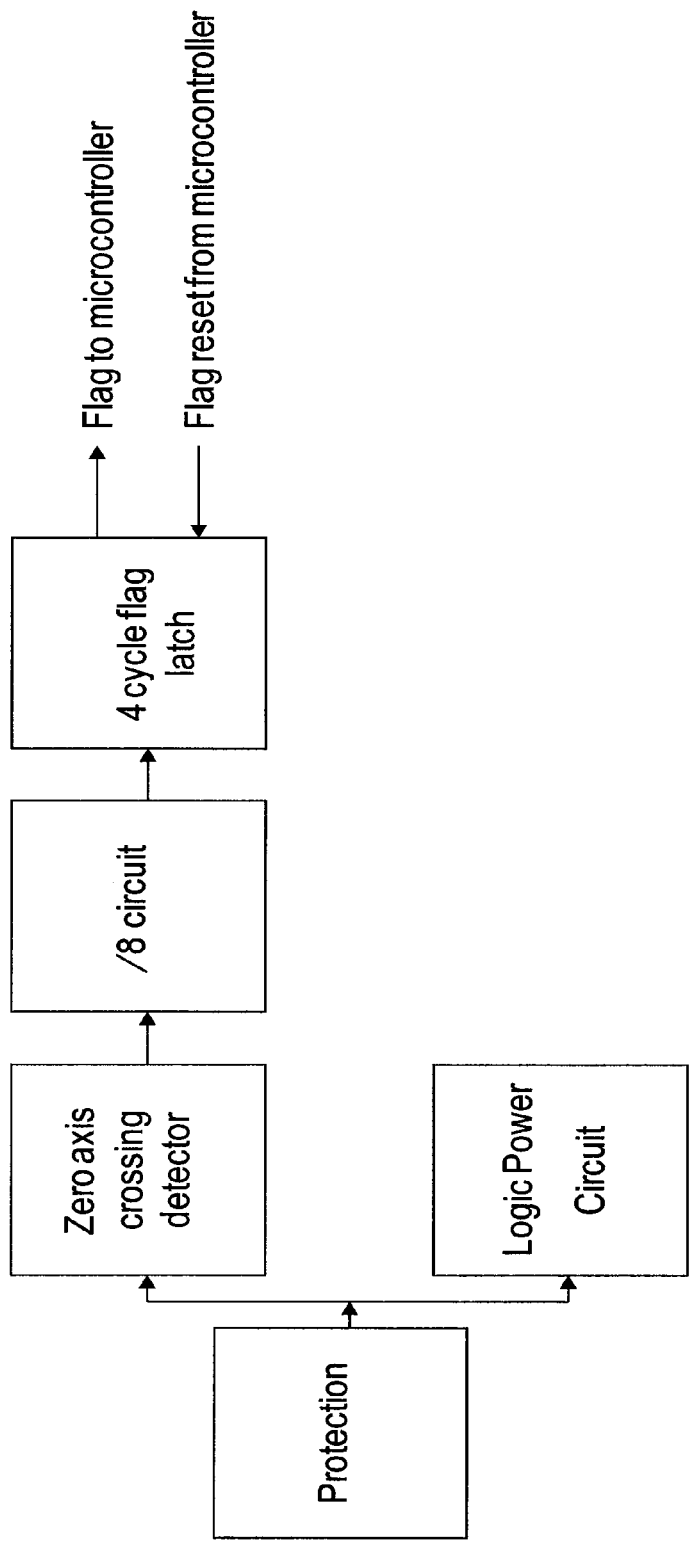
FIG. 16 illustrates a time base and power circuit in an exemplary embodiment.

FIG. 16 represents the high level design of the electronic circuit that controls both the time base used for sampling energy consumption, as well as the derivation of the required logic board power. Alternating current (AC) input voltage is obtained from one of the potential transformers (FIG. 3) and is fed to the protection circuit. The protection circuit is required to protect the electronics from voltage spikes and transients normally encountered in an electrical environment. The raw direct current (DC) signal from a half-wave center-tapped bridge rectifier circuit (120 pulses per second) is fed to a zero axis crossing detector to form a 120 hertz square wave. This 120 hertz digital square wave signal is fed to a divide by 8 counter chain composed of flip flops as is known to those skilled in the art. The 15 Hz square wave signal timed to the incoming power feed is used to set a latch "on" corresponding to one cycle of the 15 Hz signal (four cycles of 60 Hz). The latch then raises a flag that the microcontroller examines in FIG. 25, block 2510. If the 4 cycle flag is set, the microcontroller enters the watt-hour consumption routine of FIG. 17 or FIG. 18. The 120 pulses per second raw DC signal is rectified, filtered, and regulated to supply the voltages required by the base electronic system as shown in FIG. 1 and FIG. 15.

For every eight crossings of the alternating current power feed to the Smart Circuit Breaker through the zero axis, the 4 cycle latch is set to signal the microcontroller to compute a consumption value as illustrated in the system loop processing logic of FIG. 25. Upon executing the watt-hour consumption routine, the microcontroller clears the 4 cycle latch. Watt-hour consumption information is passed onto the Web Service for accumulation and presentation to the consumer by default every 10 minutes. The data transmission interval is configurable and is stored in non-volatile EEROM. The data is transported to the Web Service by one of the following transport technologies, IEEE 802.11a/b/g/n, Bluetooth, HomePlug, BPL, PLC, WiMAX, ZigBee®, or fiber optic line driver system.

Figure 17:
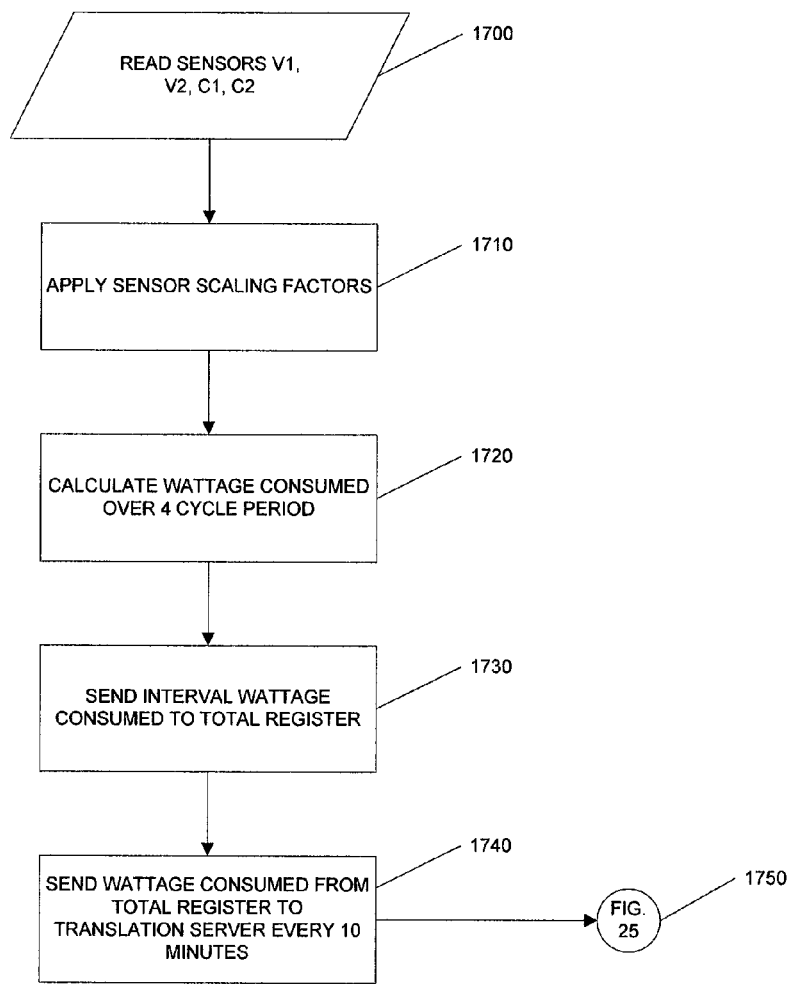
FIG. 17 illustrates processing logic for monitoring energy consumption using a Smart Circuit Breaker in a single phase system in an exemplary embodiment.

FIG. 17 illustrates processing logic for monitoring energy consumption for the Smart Circuit Breaker single phase system in an exemplary embodiment. Processing commences with reading of sensors V1, V2, C1, and C2 as indicated in block 1700. Scaling factors are applied to the sensor readings as indicated in block 1710. The wattage consumed over a four cycle period is then calculated using the scaled sensor readings in block 1720. The wattage consumed in this time interval is sent to a "total wattage" register in the microprocessor memory as indicated in block 1730. The wattage consumed is sent from the register to the translation server periodically (e.g., every 10 minutes) as indicated in block 1740. Processing then returns to the system loop of FIG. 25 as indicated by connector 1750.

To accomplish the temperature monitoring function in one embodiment, the microcontroller utilizes temperature sensor T1 as depicted in FIGS. 6A-6B to determine the temperature of the panel board. The microcontroller scales the value and then compares it to a preset alarm threshold value. If the alarm threshold value is exceeded, the microcontroller formats an alarm message and passes it to the Translation Server or the Energy Plug for notification. If the Web Energy Monitoring and Presentation service is capable of displaying the alarm, the message is formatted as appropriate by the Translation Server and transmitted to the Energy Monitoring and Presentation service for display to the consumer. T1 can be a thermistor as shown in FIG. 6A, or a temperature sensor integrated circuit as shown in FIG. 6B.

Figure 19:
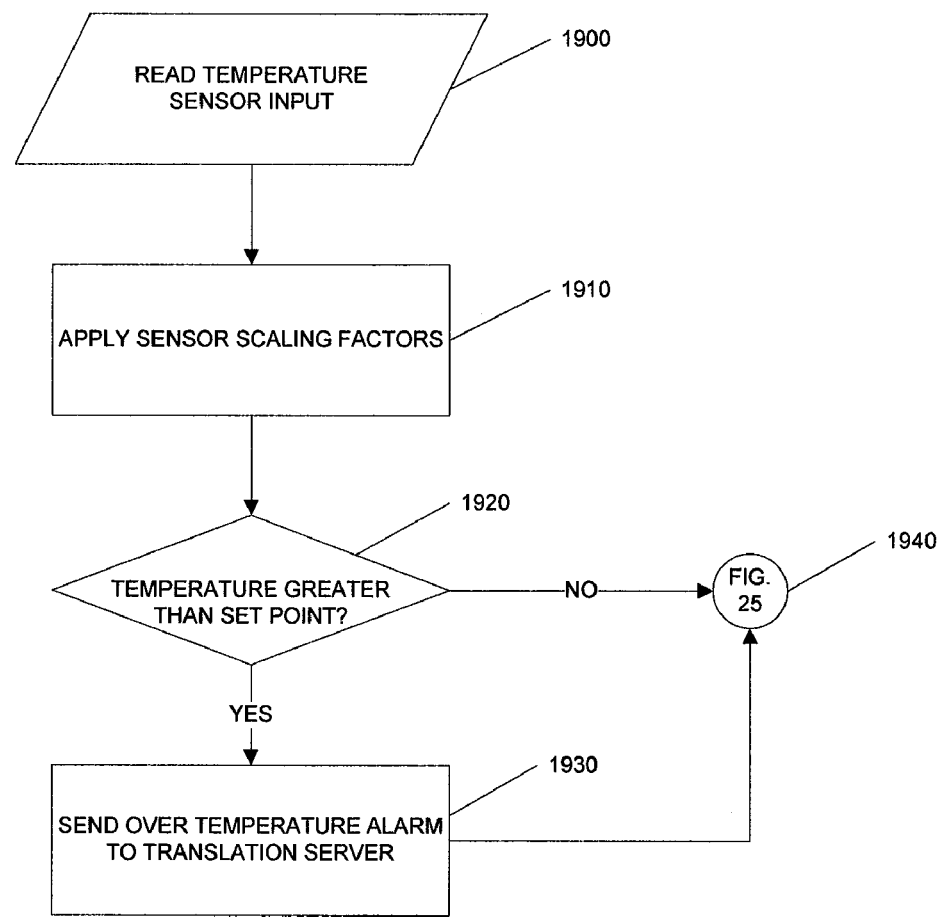
FIG. 19 illustrates processing logic for determining ambient uncompensated panel board temperature in an exemplary embodiment.

FIG. 19 illustrates processing logic for determining ambient uncompensated panel board temperature in an exemplary embodiment. The temperature sensor input is read in block 1900. Scaling factors are applied to the sensor readings in block 1910. A determination is then made in decision block 1920 whether the temperature is greater than the set point alarm value. If the temperature does not exceed the set point, processing returns to the system loop of FIG. 25 as indicated by connector 1940. If the temperature does exceed the set point, a temperature alarm is sent to the translation server as indicated in block 1930. Processing then returns to the system loop of FIG. 25 as indicated by connector 1940.

Figure 20:
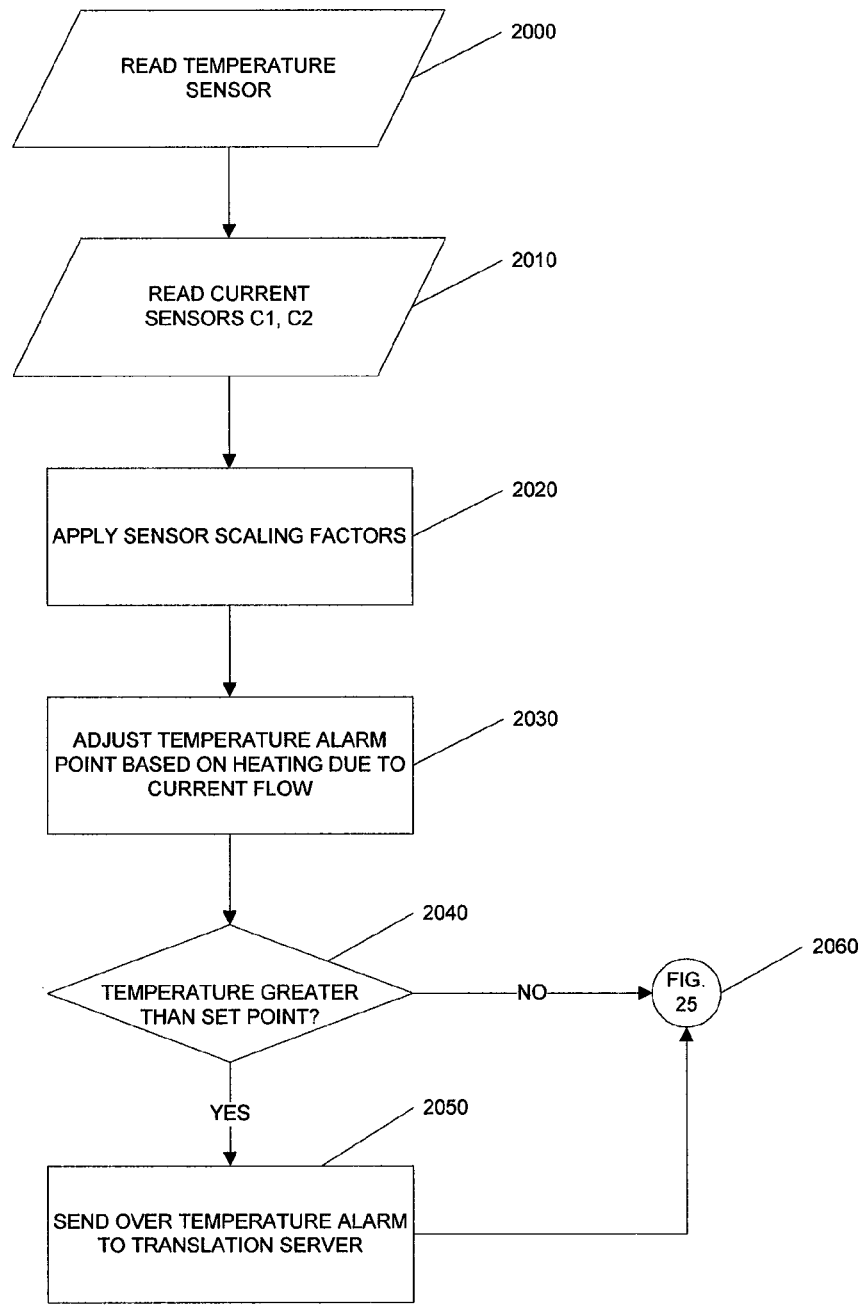
FIG. 20 illustrates processing logic for determining ambient compensated panel board temperature in an exemplary embodiment.

To accomplish the temperature monitoring function in an optional temperature sensing method, the microcontroller again utilizes sensor T1 as depicted in FIGS. 6A-6B to determine the temperature of the panel board (block 2000). FIG. 20 illustrates processing logic for ambient compensated panel board temperature sensing in an exemplary embodiment. The microcontroller reads current sensors C1 and C2 (block 2010). The values are scaled with the stored calibration factors (block 2020). The microcontroller then adjusts the alarm set point based on the heating due to normal current flow in the panel board (block 2030). If the alarm temperature threshold value is exceeded (decision block 2040), the microcontroller formats an alarm message and passes it to the Translation Server for notification (block 2050). If the Web Energy Monitoring and Presentation service is capable of displaying the alarm, the message is formatted, as appropriate, by the Translation Server and transmitted to the Energy Monitoring and Presentation service for display to the consumer. Processing then returns to the system loop of FIG. 25 as indicated by connector 2060.

Figure 8:
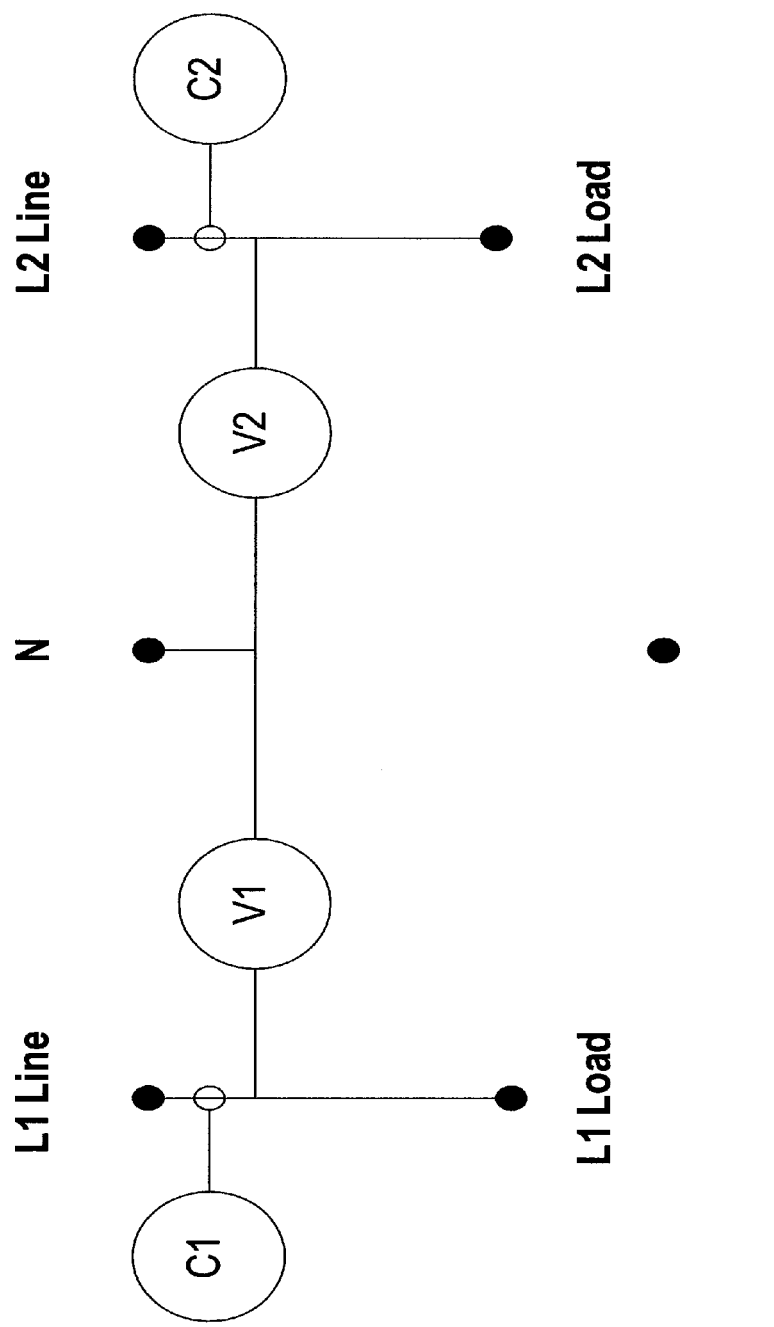
FIG. 8 illustrates the sensors used to determine the condition of the neutral conductor using a Smart Circuit Breaker in a single phase system in an exemplary embodiment.

To accomplish the neutral conductor deterioration sensing functionality for single phase systems, the microcontroller utilizes voltage sensors V1, V2 in conjunction with current sensors C1, C2 to determine the condition of the neutral conductor as illustrated in FIG. 8. The base electronic system shown in FIG. 1 determines the state of the neutral conductor based on the following parameters: a Δ of V1 and V2>5 volts (default value) with current flow in both C1 and C2 represents an alarm condition. This condition is passed onto the Web Service for presentation and alerting of the consumer.

Figure 21:
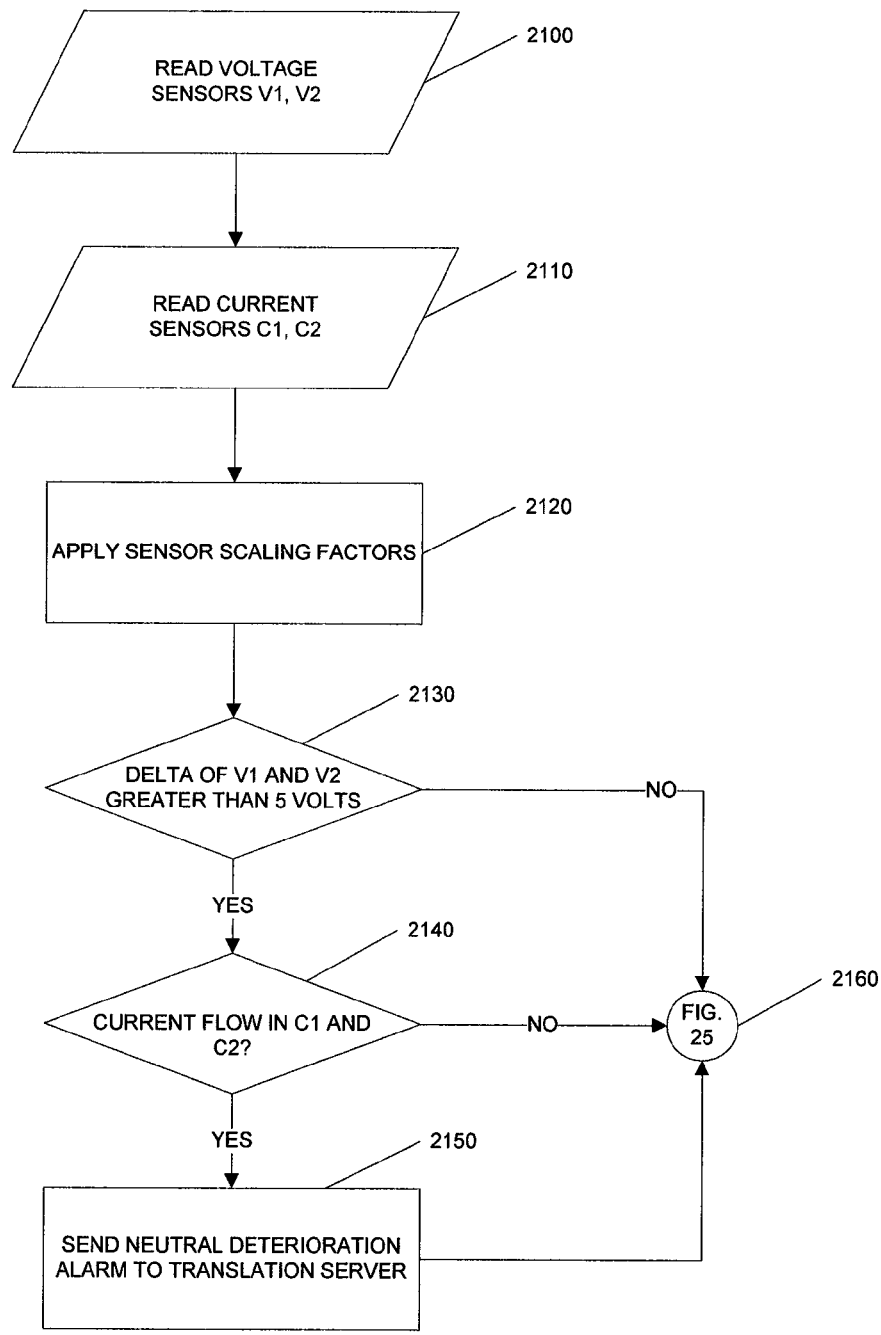
FIG. 21 illustrates processing logic for determining neutral conductor deterioration using a Smart Circuit Breaker in a single phase system in an exemplary embodiment.

FIG. 21 illustrates processing logic for determining neutral conductor deterioration for the Smart Circuit Breaker single phase system in an exemplary embodiment. The voltage sensors V1, V2 are read in block 2100. The current sensors C1, C2 are read in block 2110. Scaling factors are applied to the sensor values in block 2120. A determination is made in decision block 2130 if the voltage difference between V1 and V2 exceeds five volts. If the voltage difference exceeds five volts, a determination is then made of current flow in sensors C1 and C2 as indicated in decision block 2140. If there is current flow in both C1 and C2, a neutral deterioration alarm is sent to the translation server as indicated in block 2150. Processing then returns to the system loop of FIG. 25 as indicated by connector 2160.

Figure 9:
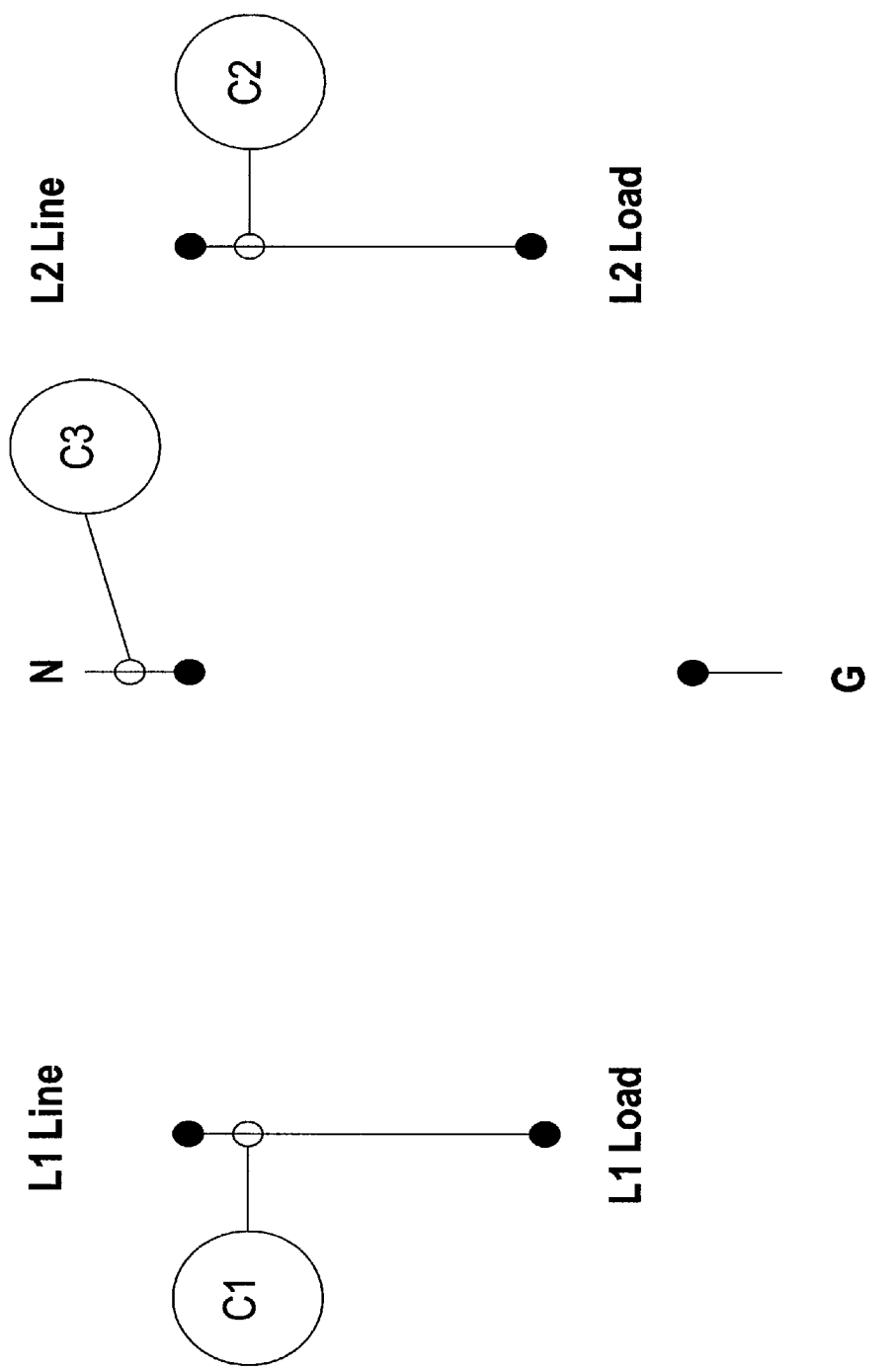
FIG. 9 illustrates the sensors used to determine the leakage current using a Smart Circuit Breaker in a single phase system in an exemplary embodiment.

To accomplish the leakage current sensing functionality for single phase systems, the microprocessor utilizes current sensors C1, C2 and C3 to determine the leakage current as illustrated in FIG. 9. The base electronic system shown in FIG. 1 determines the state of the leakage current based on the following parameters: a summation of the currents C1, C2 and C3 should cancel each other with less than 6 milliamps of total difference. A difference of greater than 6 milliamps (default value), represents an alarm condition and is passed onto the Web Service for presentation and alerting of the consumer. The microcontroller firmware allows the default value, stored in EEROM, to be adjusted based on service size and other electrical system characteristics.

Figure 22:
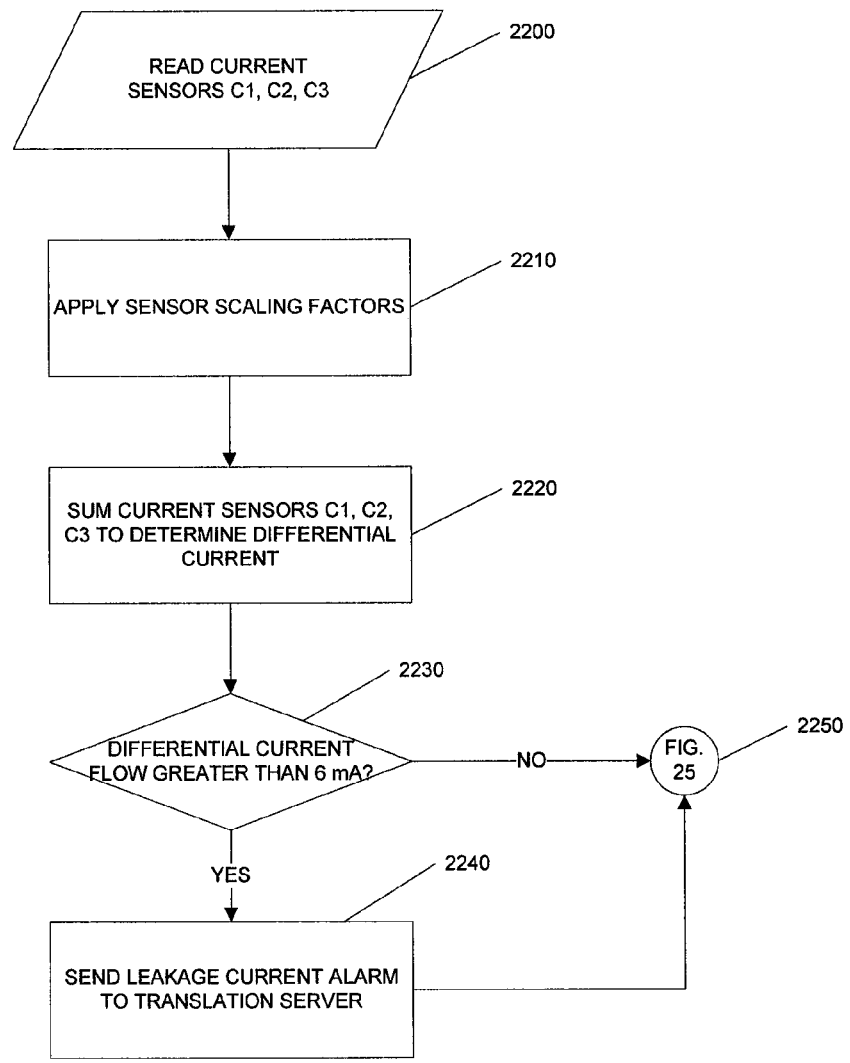
FIG. 22 illustrates processing logic for determining leakage current using a Smart Circuit Breaker in a single phase system in an exemplary embodiment.

FIG. 22 illustrates processing logic for determining leakage current for the Smart Circuit Breaker single phase system in an exemplary embodiment. Current sensors C1, C2, and C3 are read in block 2200. Scaling factors are applied to the sensor readings as indicated in block 2210. The current sensor readings are then summed to determine a current differential as shown in block 2220. If the differential current flow in the three sensors exceeds six milliamperes in decision block 2230, a leakage current alarm is sent to the translation server as indicated in block 2240. Processing then returns to the system loop of FIG. 25 as indicated by connector 2250.

Figure 10:
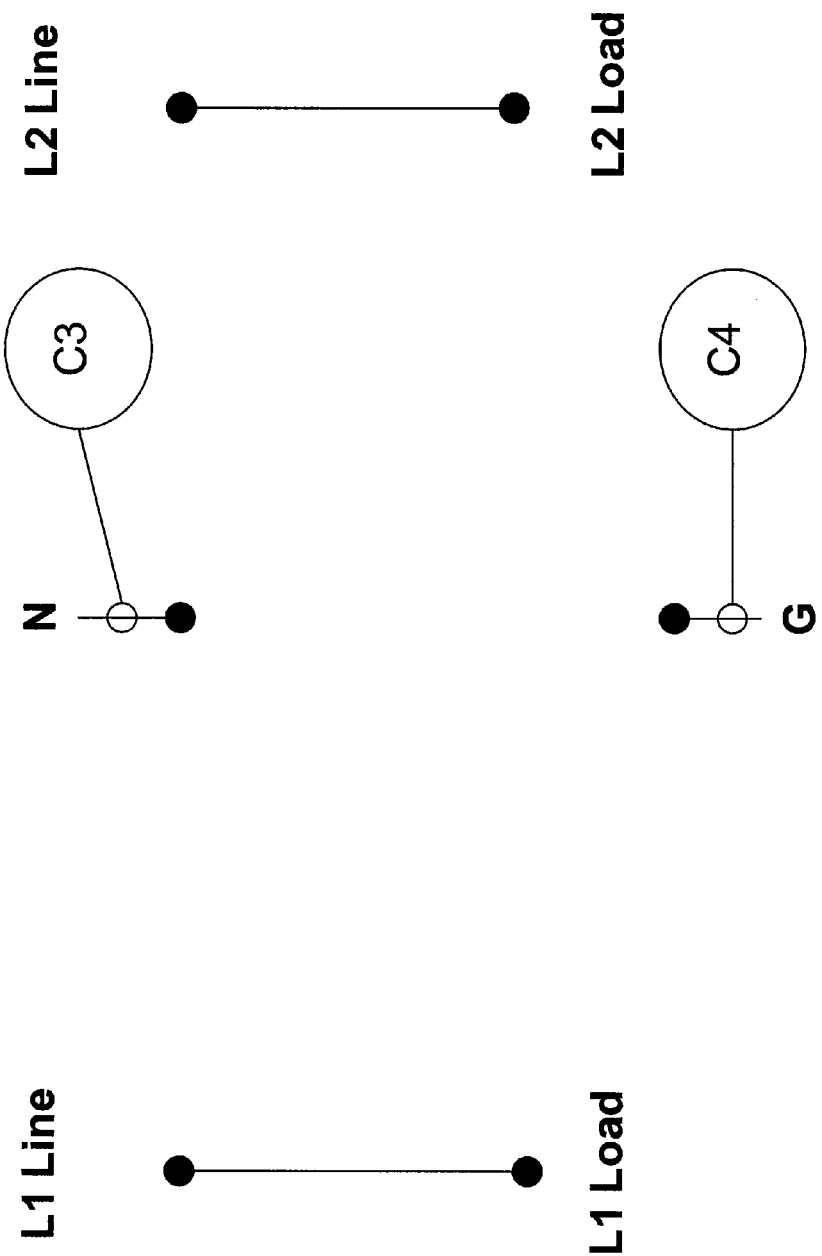
FIG. 10 illustrates the sensors used to determine ground system deterioration using a Smart Circuit Breaker in a single phase system in an exemplary embodiment.

To accomplish the deteriorating ground sensing functionality for single phase systems, the microprocessor utilizes Hall Effect current sensors C3 and C4 to determine the currents in both the neutral circuit conductor and the ground circuit conductor as illustrated in FIG. 10. The base electronic system as illustrated in FIG. 1 determines the state of the ground system based on the following parameters: the current ratio between sensors C4 and C3 should not be less than the default value of 1:2000 for a 200 ampere service. A current ratio less than 1:2000 represents an alarm condition and is passed onto the Web Service for presentation and alerting of the consumer. The microcontroller firmware allows the default ratio value of 1:2000 to be adjusted for both larger services and grounding systems that are better than anticipated.

Figure 23:
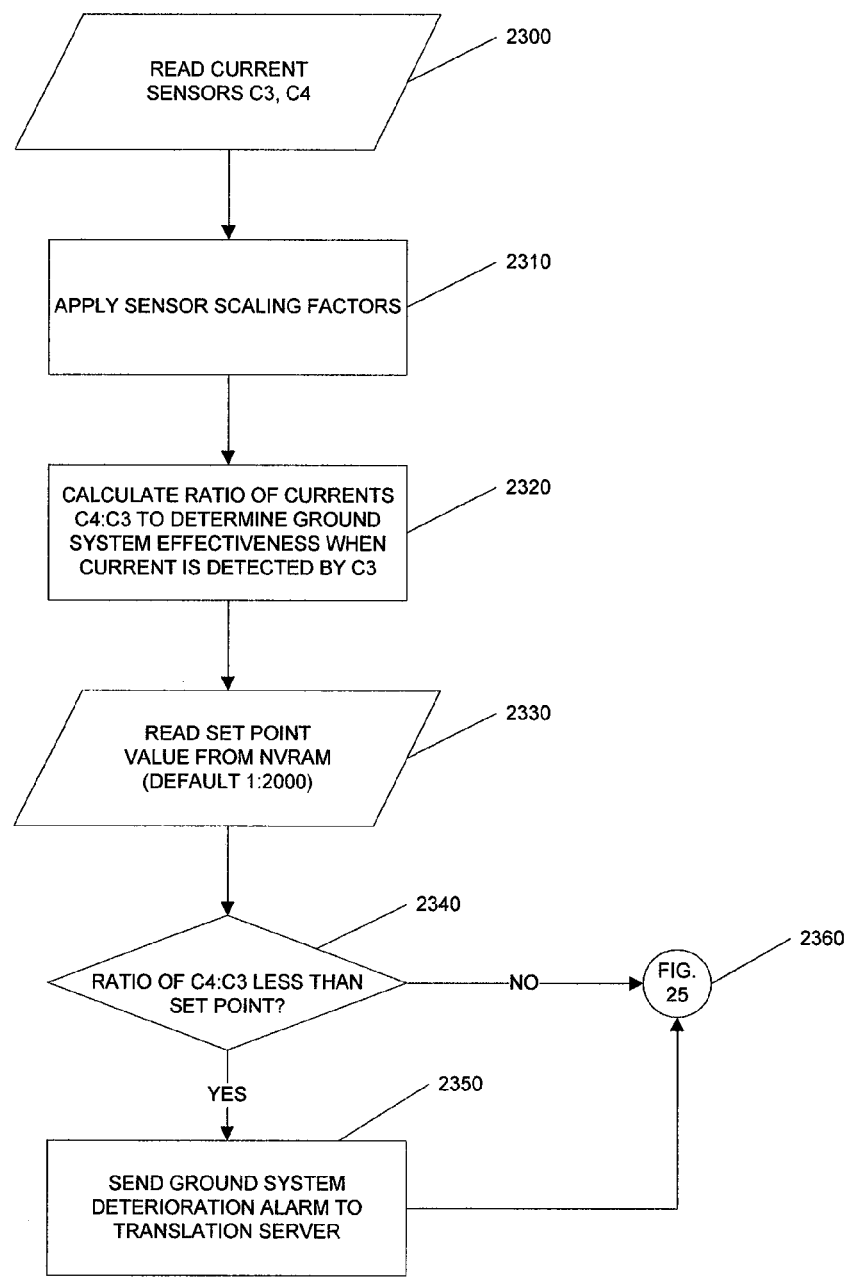
FIG. 23 illustrates processing logic for determining ground system deterioration using a Smart Circuit Breaker in a single phase system in an exemplary embodiment.

FIG. 23 illustrates processing logic for determining ground system deterioration for the Smart Circuit Breaker single phase system in an exemplary embodiment. The Hall Effect current sensors are read as indicated in block 2300. Scaling factors are applied to the sensor values in block 2310. The ratio of current C4 to current C3 is calculated to determine ground effectiveness as indicated in block 2320. A set point threshold value for this ratio is then read from non-volatile RAM (NVRAM) as shown in block 2330. The default value for this ratio is 1:2000 in an exemplary embodiment. If the ratio of current C4 to current C3 is less than the set point, as determined in decision block 2340, a ground system deterioration alarm is sent to the translation server as indicated in block 2350. Processing then returns to the system loop of FIG. 25 as indicated by connector 2360.

Three Phase Systems

Three phase electricity powers large industrial loads in Wye or Delta configurations. The Wye is a four-wire system which provides two different supply voltages. The center point of the Wye configuration is the system neutral and is usually grounded. In a Wye system, the phase unbalance current is carried by the system neutral. The Delta configuration may be supplied as an ungrounded three-wire system, or more commonly as a grounded four wire system. The center tap of one side is grounded to create a neutral conductor for the customer.

Figure 11:
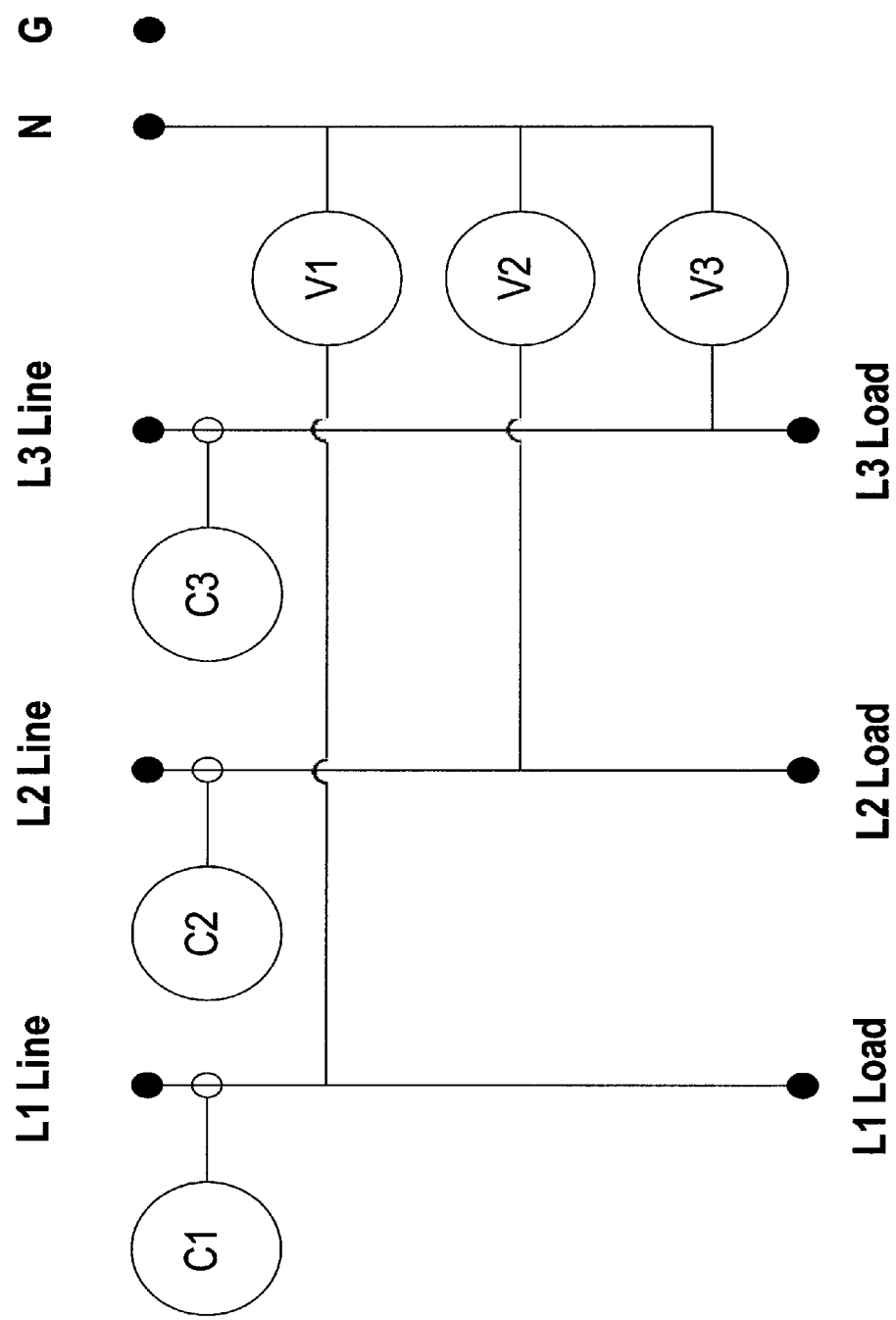
FIG. 11 illustrates the sensors used to determine the wattage consumed using a Smart Circuit Breaker in a three phase Wye system in an exemplary embodiment.

FIG. 15 represents the high level design of the electronic circuit board that controls the energy monitoring function of the three phase Smart Circuit Breaker. The base electronic system for three phase systems determines the consumption and formats the data for transmission to either the Translation Server or the Energy Plug for accumulation and presentation to the consumer. To accomplish the energy monitoring function for three phase systems, the microprocessor utilizes voltage sensors V1, V2, and V3, in conjunction with sensors C1, C2 and C3, to determine the wattage consumed as illustrated in FIG. 11 (Wye configuration) and FIG. 12 (Delta configuration). The base electronic system derives its timing from the 60 Hz power line as shown in FIG. 16. For every eight crossings of the alternating current power feed to the Smart Circuit Breaker through the zero axis, the 4 cycle latch is set to signal the microcontroller to compute an energy consumption value as illustrated in the system loop processing logic of FIG. 25. Upon executing the watt-hour consumption routine, the microcontroller clears the 4 cycle latch. Watt-hour energy consumption information is passed onto the Web Service for accumulation and presentation to the consumer by default every 10 minutes. The data transmission interval is configurable and is stored in non-volatile EEROM. The data is transported to the Web Service by one of the following transport technologies: IEEE 802.11 a/b/g/n, Bluetooth, HomePlug, BPL, PLC, WiMAX, ZigBee®, or fiber optic line driver system.

Figure 18:
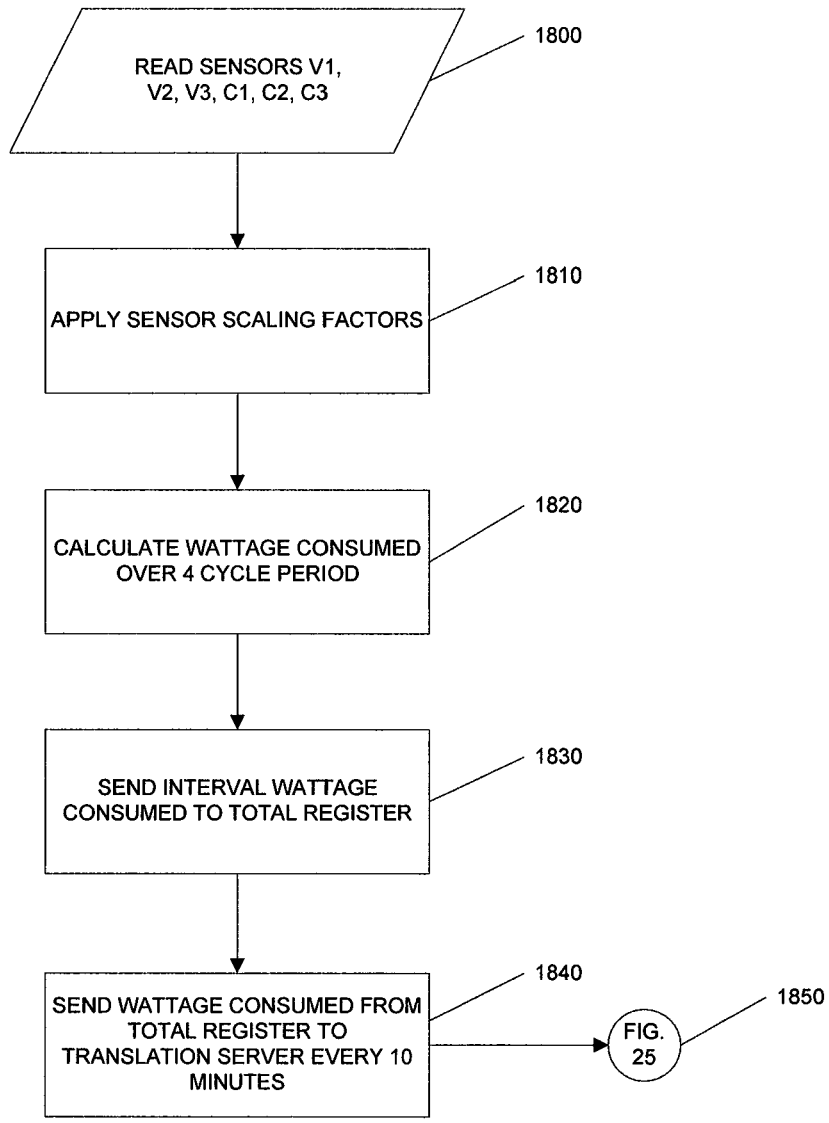
FIG. 18 illustrates processing logic for monitoring energy consumption using a Smart Circuit Breaker in a three phase system in an exemplary embodiment.

FIG. 18 illustrates processing logic for monitoring energy consumption using the Smart Circuit Breaker in a three phase system in an exemplary embodiment. Processing is identical to FIG. 17 for a single phase system, except for the current and voltage sensors that are read. Processing commences with reading of sensors V1, V2, V3, C1, C2, and C3 as indicated in block 1800. These sensor inputs are processed as shown in FIGS. 3-5 and as described above for single phase systems. Scaling factors are applied to the sensor readings as indicated in block 1810. The wattage consumed over a four cycle period is then calculated using the scaled sensor readings in block 1820. The wattage consumed in this time interval is sent to a "total wattage" register in the microprocessor memory as indicated in block 1830. The total wattage consumed is sent from the register to the translation server periodically (e.g., every 10 minutes) as indicated in block 1840. Processing then returns to the system loop as indicated by connector 1850.

The temperature monitoring function for the three phase Smart Circuit Breaker is handled in the same way as for the single phase Smart Circuit Breaker. The microcontroller utilizes temperature sensor T1 as depicted in FIGS. 6A-6B to determine the temperature of the panel board. The microcontroller scales the value and then compares it to a preset alarm threshold value. If the alarm threshold value is exceeded, the microcontroller formats an alarm message and passes it to the Translation Server or the Energy Plug for notification. If the Web Energy Monitoring and Presentation service is capable of displaying the alarm, the message is formatted as appropriate by the Translation Server and transmitted to the Energy Monitoring and Presentation service for display to the consumer. The processing logic of either FIG. 19 or FIG. 20 is used depending on whether or not the panel board temperature is compensated.

Figure 26:
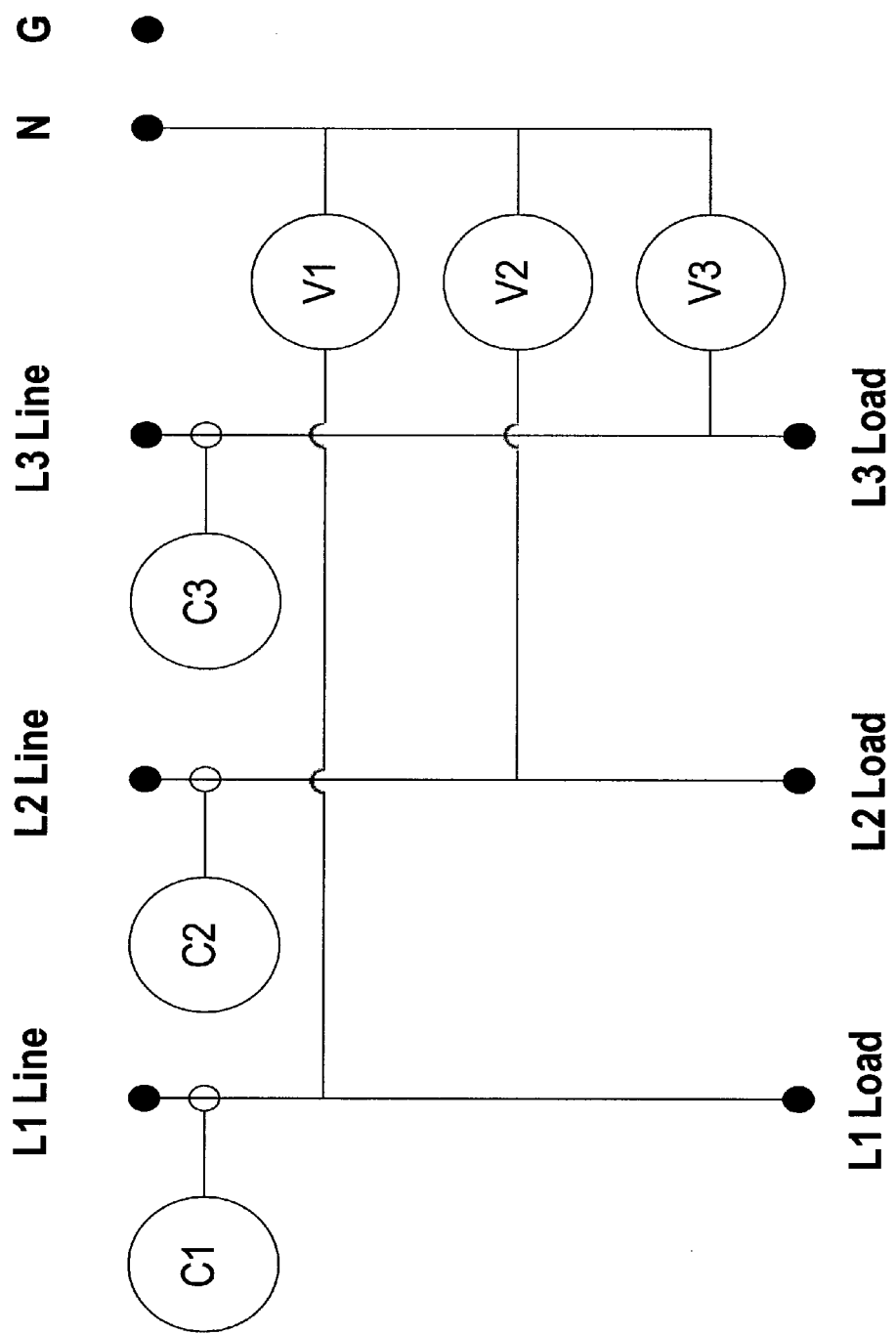
FIG. 26 illustrates the sensors used to determine the condition of the neutral conductor using a Smart Circuit Breaker in a three phase Wye system in an exemplary embodiment.

To accomplish the neutral conductor deterioration sensing functionality for three phase Wye systems, the microcontroller utilizes voltage sensors V1, V2, V3 in conjunction with current sensors C1, C2 and C3 to determine the condition of the neutral conductor as illustrated in FIG. 26. The base electronic system illustrated in FIG. 15 determines the state of the neutral conductor based on the following parameters: a Δ of V1, V2, and V3>5 volts (default value) with current flow in C1, C2, and C3 represents an alarm condition. This condition is passed onto the Web Service for presentation and alerting of the consumer.

Figure 30:
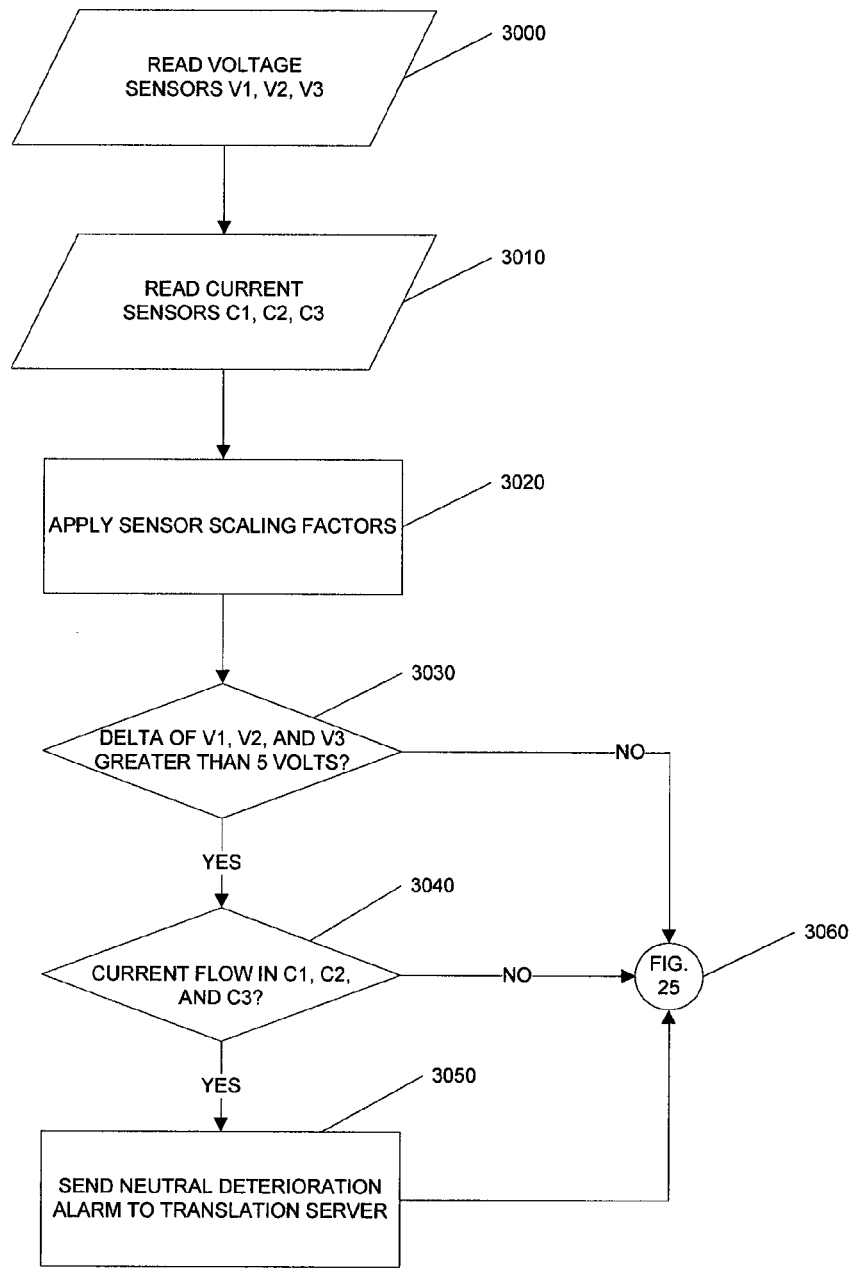
FIG. 30 illustrates processing logic for determining neutral conductor deterioration using a Smart Circuit Breaker in a three phase Wye system in an exemplary embodiment.

FIG. 30 illustrates processing logic for determining neutral conductor deterioration using the Smart Circuit Breaker in a three phase Wye system in an exemplary embodiment. The voltage sensors V1, V2, and V3 are read in block 3000. The current sensors C1, C2, and C3 are read in block 3010. Scaling factors are applied to the sensor readings as indicated in block 3020. In decision block 3030, a determination is made if there is a difference in voltage between V1, V2, and V3 greater than five volts. If the voltage difference exceeds five volts, a determination is made in decision block 3040 if there is current flow in C1, C2, and C3. If there is, a neutral deterioration alarm is sent to the translation server as indicated in block 3050. Processing then returns to the system loop as indicated by connector 3060.

Figure 27:
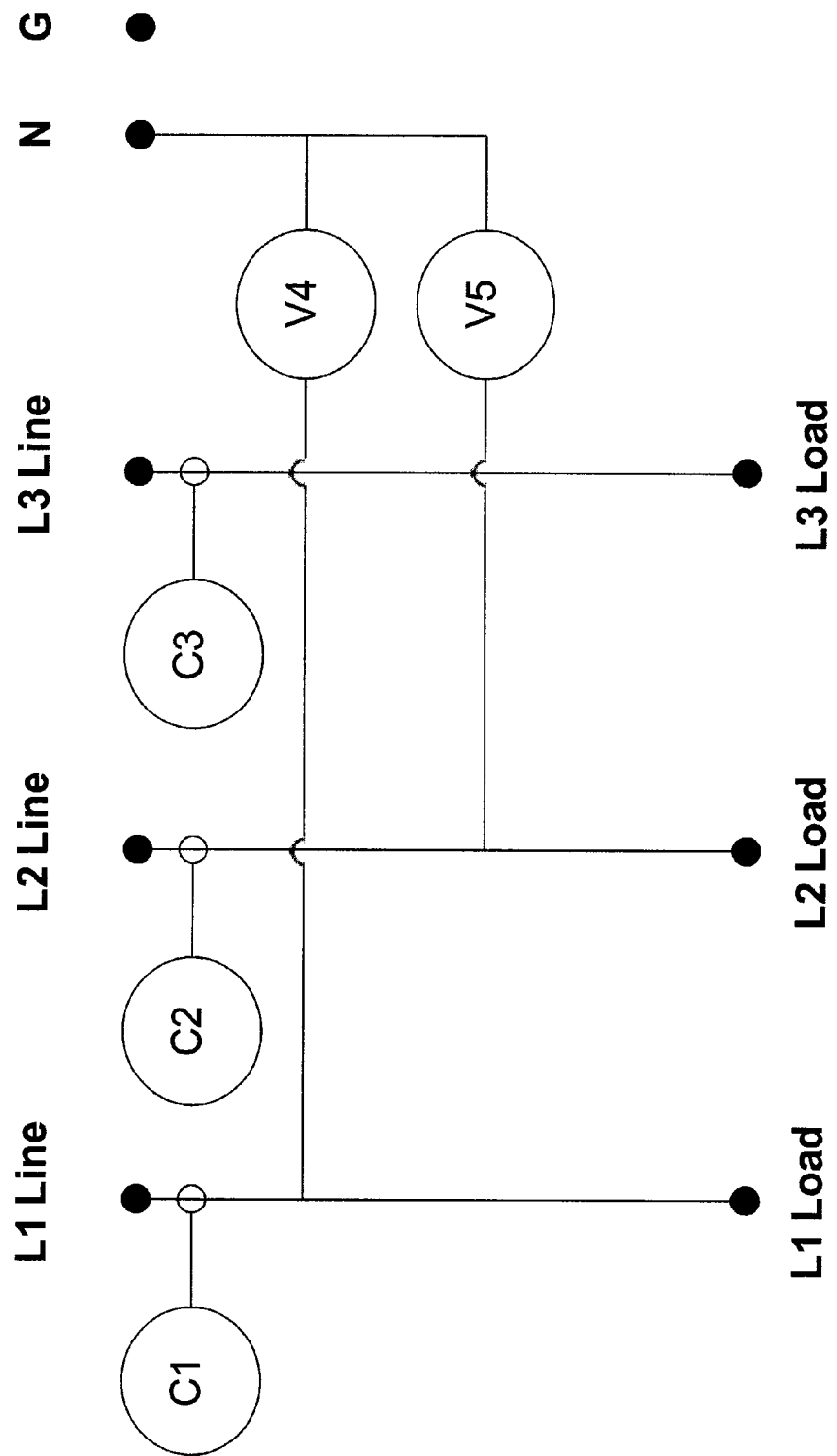
FIG. 27 illustrates the sensors used to determine the condition of the neutral conductor using a Smart Circuit Breaker in a center tap grounded Delta system in an exemplary embodiment.

To accomplish the neutral conductor deterioration sensing functionality for three phase center grounded Delta systems, the microcontroller utilizes voltage sensors V4 and V5 in conjunction with current sensors C1, C2, and C3 to determine the condition of the neutral conductor as illustrated in FIG. 27. The base electronic system as illustrated in FIG. 15 determines the state of the neutral conductor based on the following parameters: a Δ of V4 and V5>5 volts (default value) with current flow in C1, C2, and C3 represents an alarm condition. This condition is passed onto the Web Service for presentation and alerting of the consumer.

Figure 31:
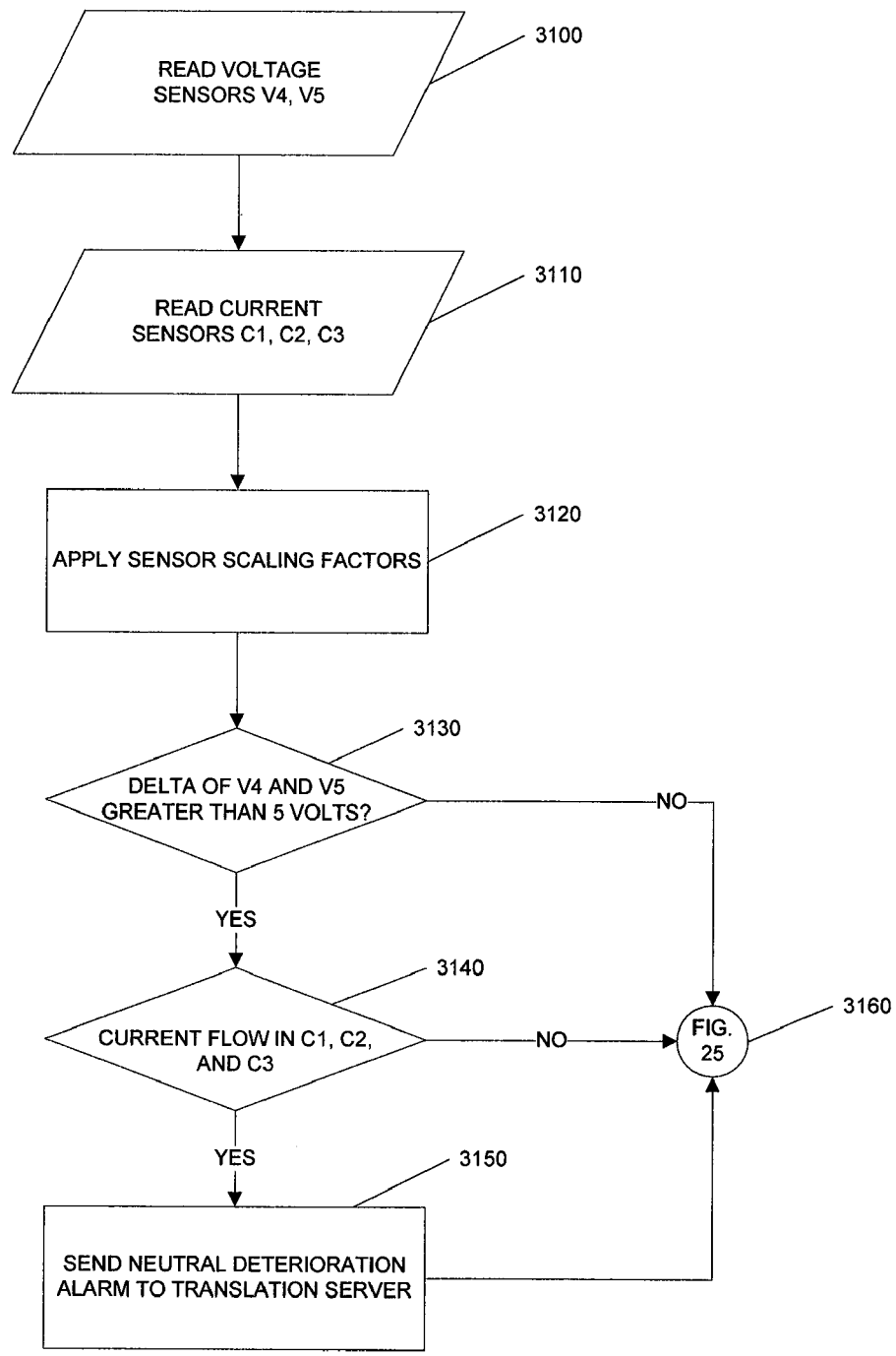
FIG. 31 illustrates processing logic for determining neutral conductor deterioration using a Smart Circuit Breaker in a three phase center tap grounded Delta system in an exemplary embodiment.

FIG. 31 illustrates processing logic for determining neutral conductor deterioration using the Smart Circuit Breaker in a three phase center tap grounded Delta system in an exemplary embodiment. The voltage sensors V4 and V5 are read in block 3100. The current sensors C1, C2, and C3 are read in block 3110. Scaling factors are applied to the sensor readings as indicated in block 3120. In decision block 3130, a determination is made if there is a difference in voltage between V4 and V5 that is greater than five volts. If the voltage difference exceeds five volts, a determination is made in decision block 3140 if there is current flow in C1, C2, and C3. If there is, a neutral deterioration alarm is sent to the translation server as indicated in block 3150. Processing then returns to the system loop as indicated by connector 3160.

Figure 29:
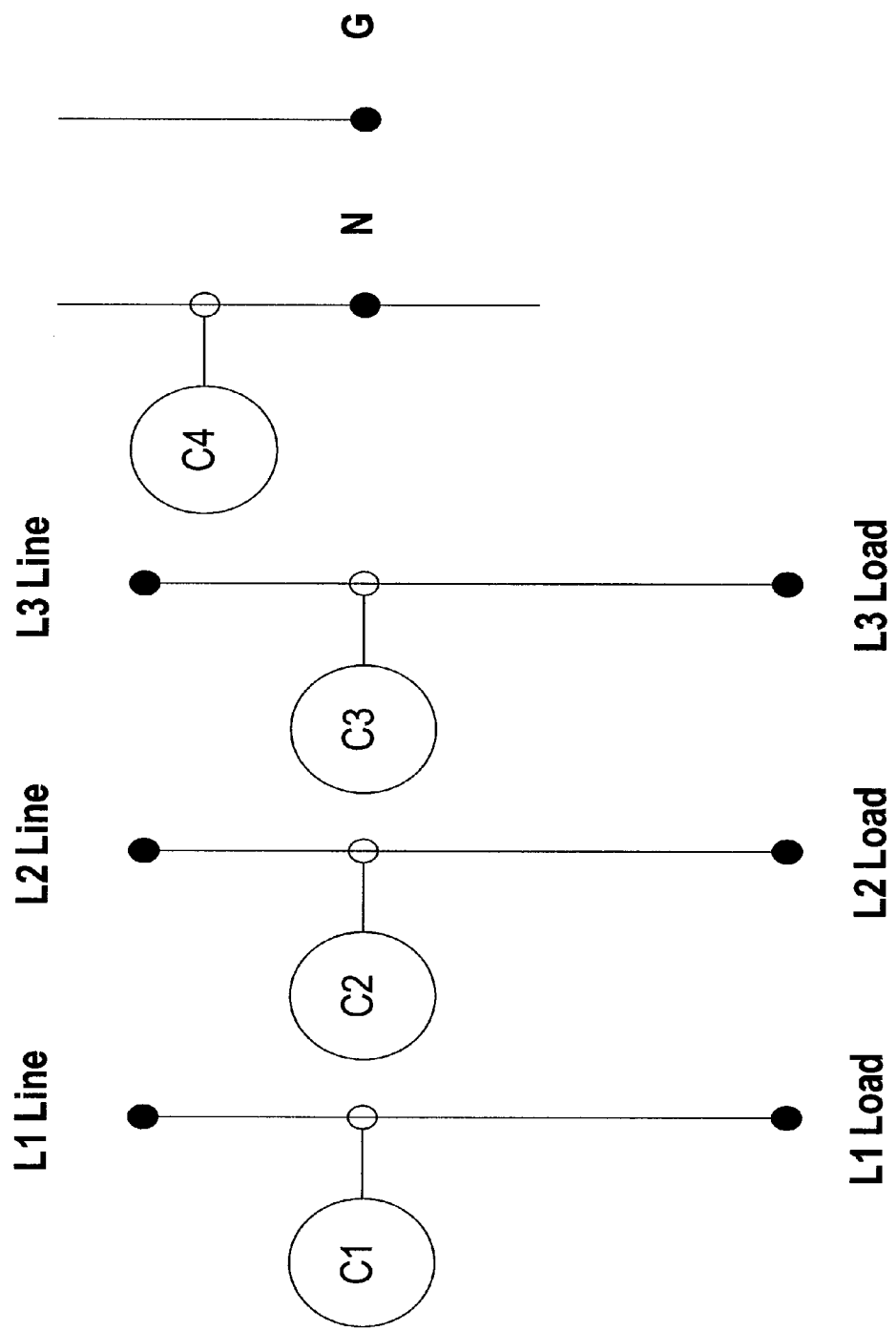
FIG. 29 illustrates the sensors used to determine the leakage current using a Smart Circuit Breaker in a three phase system in an exemplary embodiment.

To accomplish the leakage current sensing functionality for three phase systems, the microprocessor utilizes current sensors C1, C2, C3 and C4 to determine the leakage current as illustrated in FIG. 29. The base electronic system illustrated in FIG. 15 determines the state of the leakage current based on the following parameters: a summation of the currents C1, C2, C3 and C4 should cancel each other with less than 6 milliamps of total difference. A difference of greater than 6 milliamps (default value) represents an alarm condition and is passed onto the Web Service for presentation and alerting of the consumer. The microcontroller firmware allows the default value, stored in EEROM, to be adjusted based on service side and other electrical system characteristics.

Figure 32:
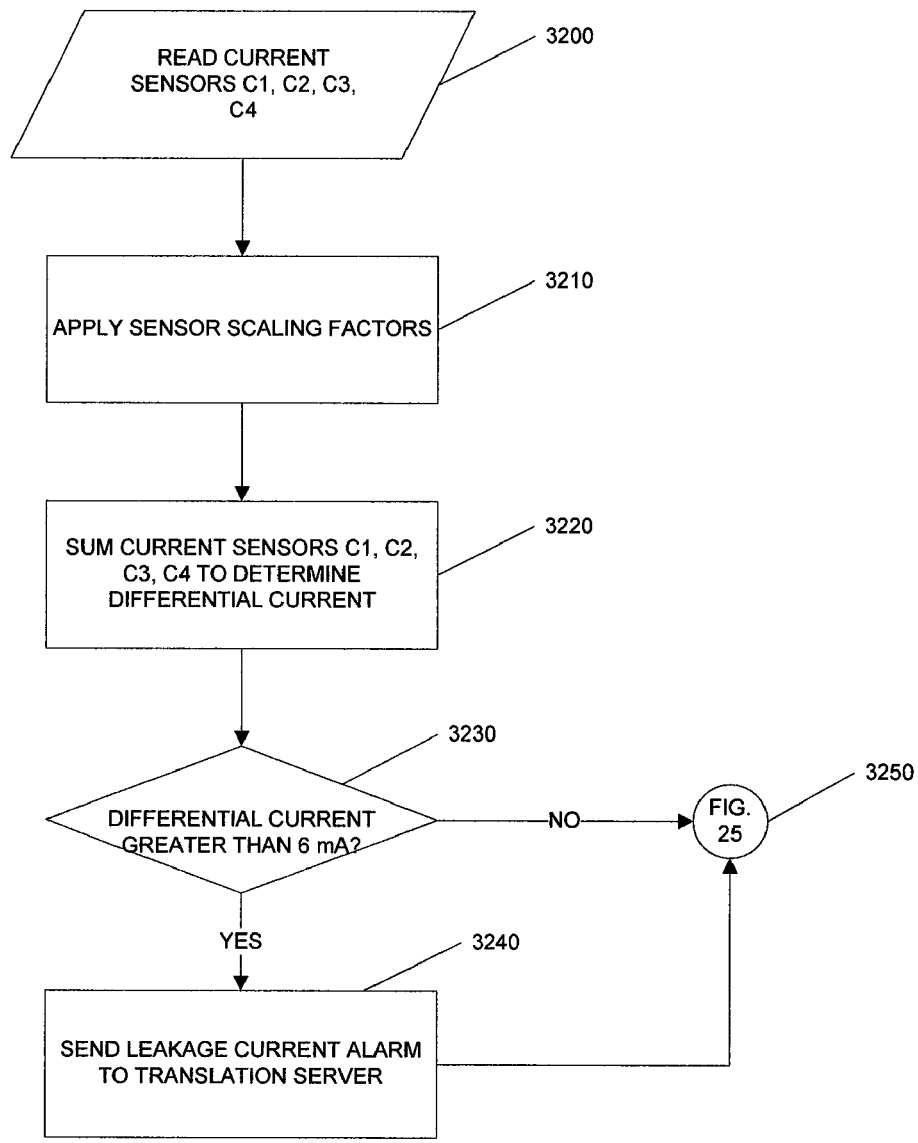
FIG. 32 illustrates processing logic for determining leakage current using a Smart Circuit Breaker in a three phase system in an exemplary embodiment.

FIG. 32 illustrates processing logic for determining leakage current using the Smart Circuit Breaker in a three phase system in an exemplary embodiment. The current sensors C1, C2, C3, and C4 are read in block 3200. Sensor scaling factors are applied to the current sensor readings in block 3210. Current sensor readings for C1, C2, C3, and C4 are summed to determine the differential current, as indicated in block 3220. A determination is then made if the differential current exceeds six milliamperes in decision block 3230. If the differential current in the four current sensors exceeds six milliamperes, a leakage current alarm is sent to the translation server as shown in block 3240. Processing then returns to the system loop as indicated by connector 3250.

Figure 28:
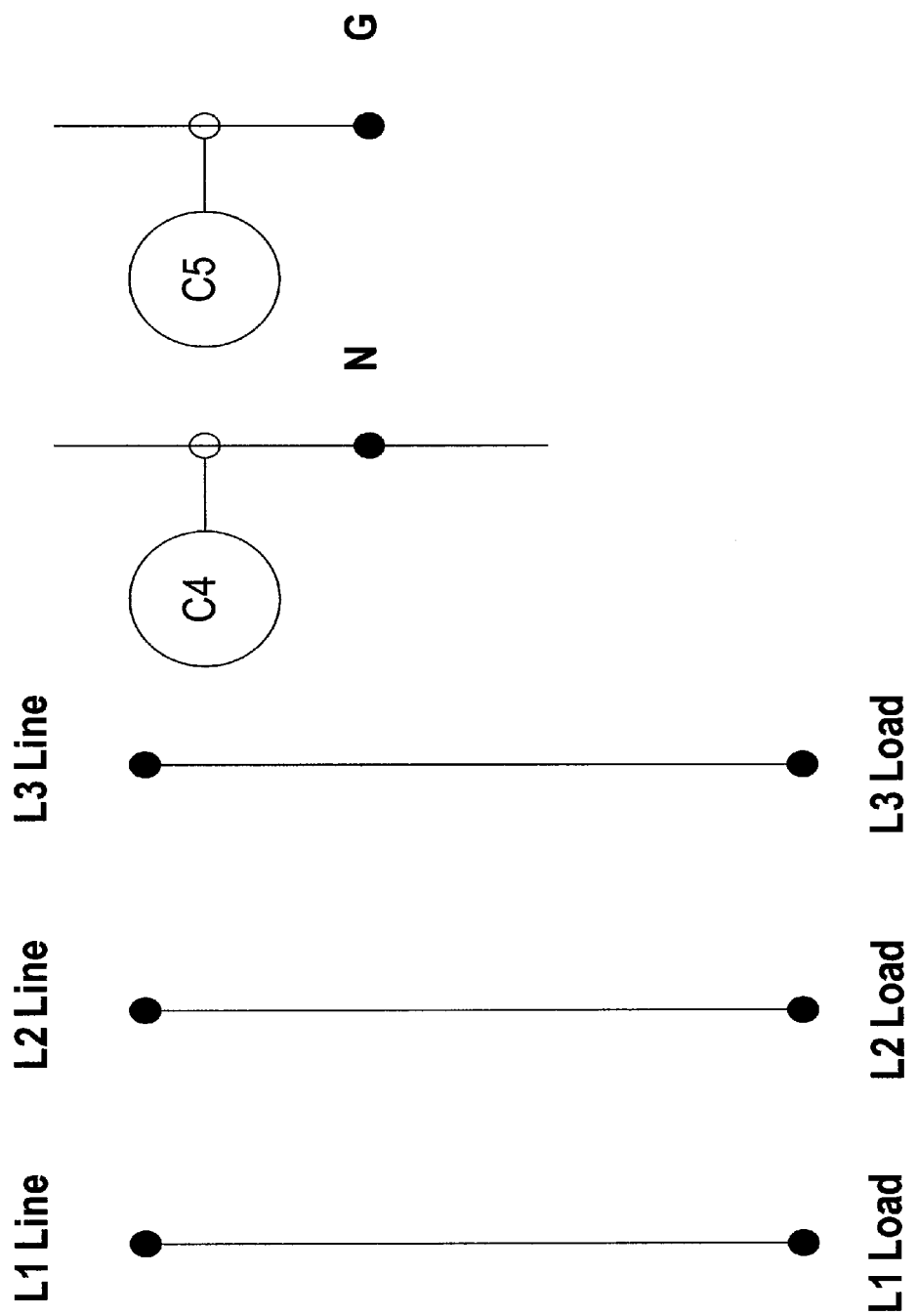
FIG. 28 illustrates the sensors used to determine ground system deterioration using a Smart Circuit Breaker in a three phase system in an exemplary embodiment.

To accomplish the deteriorating ground sensing functionality for three phase systems, the microprocessor utilizes current sensors C4 and C5 to determine the currents in both the neutral circuit conductor and the ground circuit conductor as illustrated in FIG. 28. The base electronic system, as illustrated in FIG. 15, determines the state of the ground system based on the following parameters: the current ratio between C5 and C4 should not be less than the default value of 1:2000 for a 200 amp service. A current ratio less than 1:2000 represents an alarm condition when current flow is present in the neutral conductor. This alarm condition is then passed onto the Web Service for presentation and alerting of the consumer. The microcontroller firmware allows the default ratio value of 1:2000 to be adjusted for both larger services and grounding systems that are better than anticipated.

Figure 33:
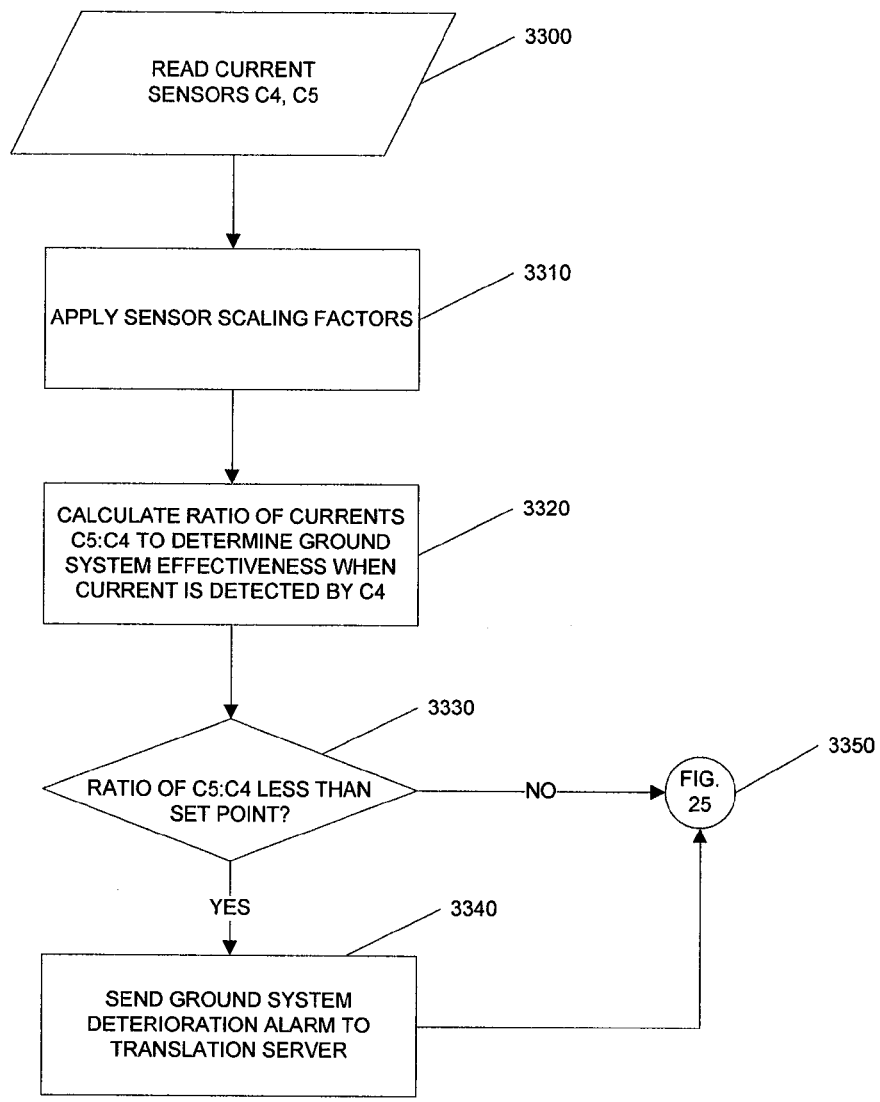
FIG. 33 illustrates processing logic for determining ground system deterioration using a Smart Circuit Breaker in a three phase system in an exemplary embodiment.

FIG. 33 illustrates processing logic for determining ground system deterioration using the Smart Circuit Breaker in a three phase system in an exemplary embodiment. Current sensors C4 and C5 are read in block 3300. Sensor scaling factors are applied as indicated in block 3310. The ratio of current sensor readings of C5:C4 is calculated to determine ground system effectiveness in block 3320. A determination is made in decision block 3330 if the ratio C5:C4 is less than a set point. If the ratio is less than the set point, a ground system deterioration alarm is sent to the translation server as shown in block 3340. Processing then returns to the system loop as indicated by connector 3350.

Figure 12:
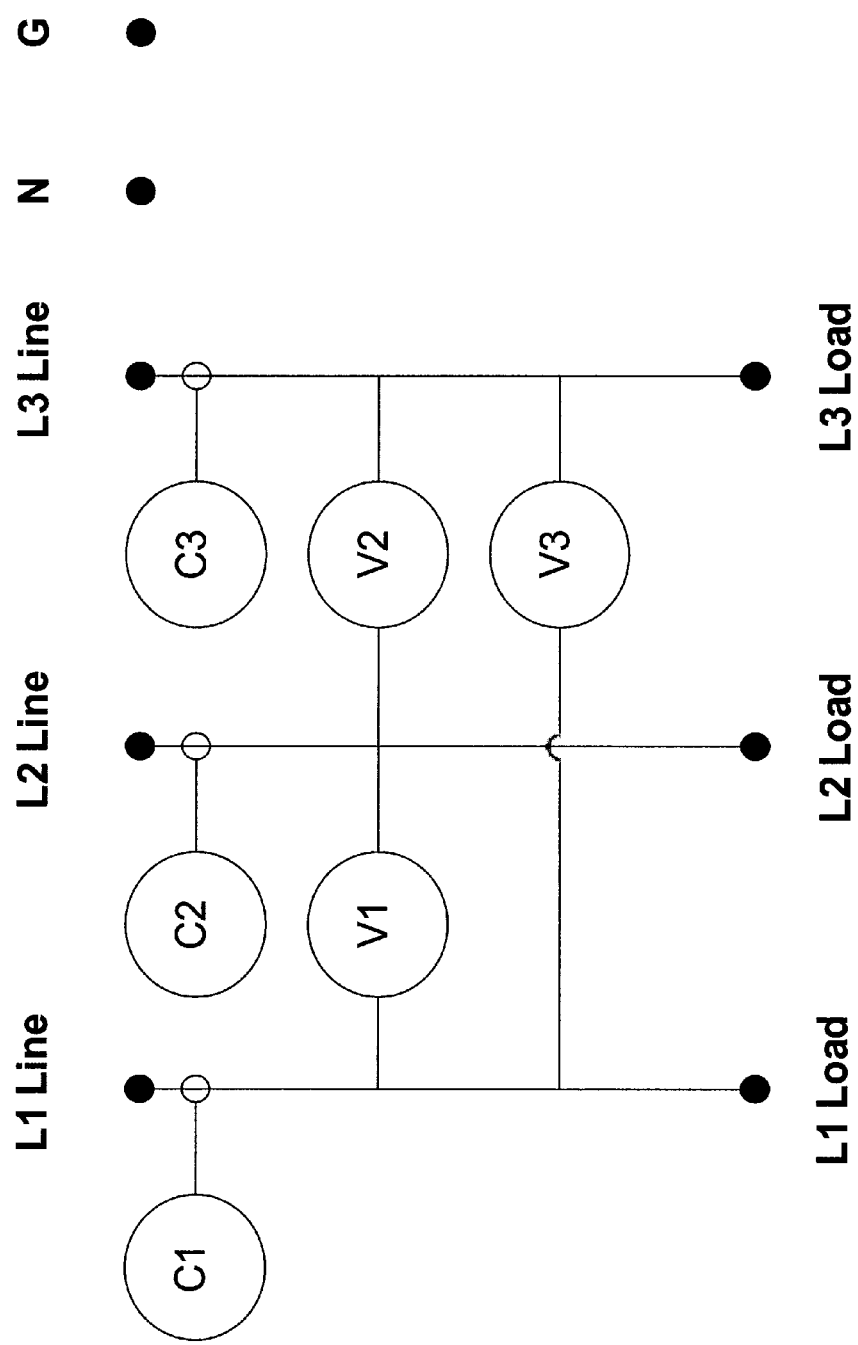
FIG. 12 illustrates the sensors used to determine the wattage consumed using a Smart Circuit Breaker in a three phase Delta system in an exemplary embodiment.

To accomplish the phase loss sensing functionality for three phase systems, the microcontroller utilizes current sensors C1, C2, C3 to determine the currents in all three system power conductors. Voltage sensors V1, V2, and V3 are used to determine the voltages for all three system conductors. There are two possible sensor configurations, as shown in FIG. 11 for Wye feed systems, and in FIG. 12 for Delta feed systems (includes open Delta systems). The base electronic system illustrated in FIG. 15 determines the condition of the phases based on the sensor inputs C1, C2, C3, V1, V2, V3 as shown in FIGS. 12 and 13.

Figure 24:
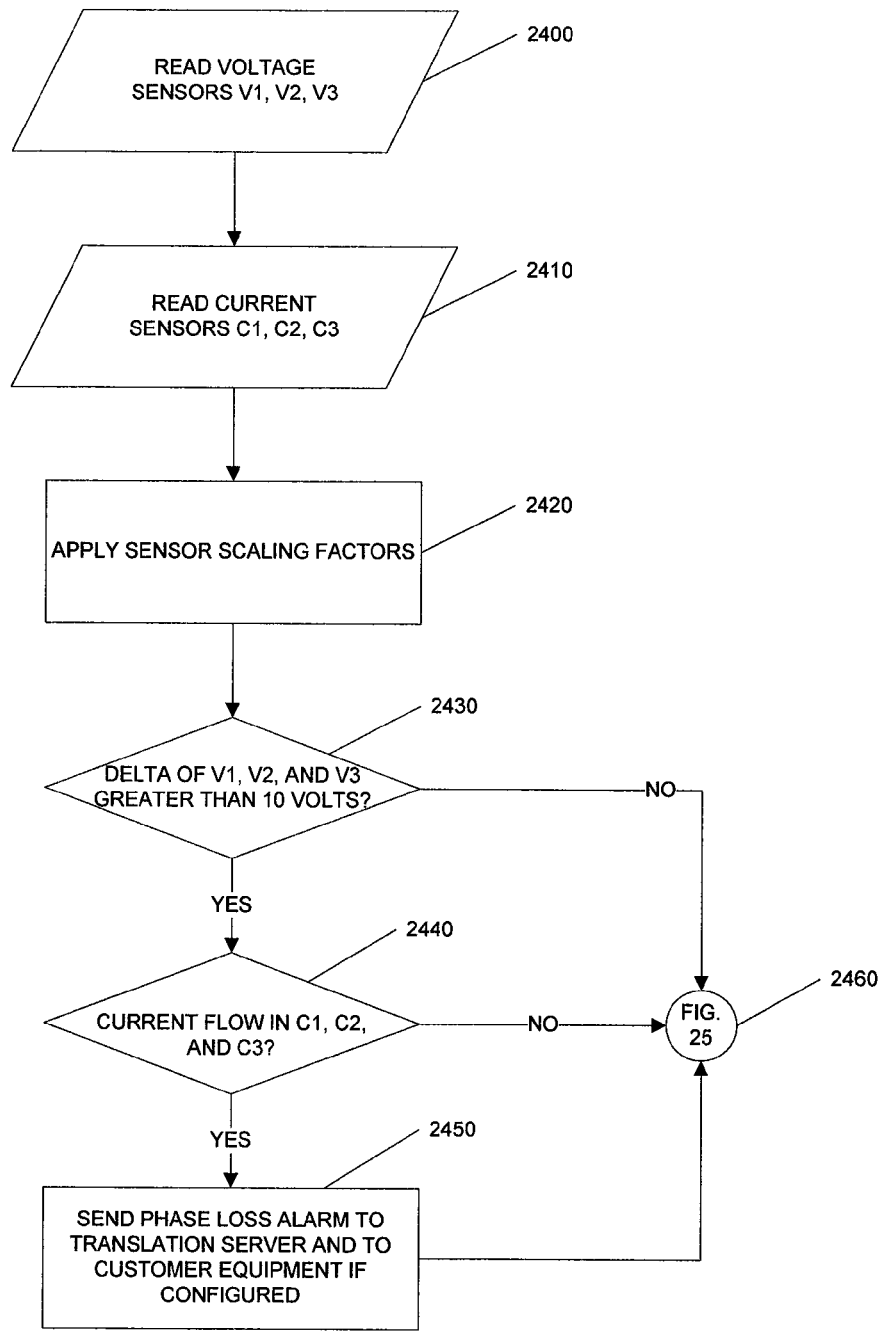
FIG. 24 illustrates processing logic for determining phase loss in a three phase system in an exemplary embodiment.

FIG. 24 illustrates processing logic for determining phase loss in a three phase system in an exemplary embodiment. In block 2400, voltage sensors V1, V2, and V3 are read. In block 2410, current sensors C1, C2, and C3 are read. Scaling factors are applied to the sensor readings as shown in block 2420. In decision block 2430, a determination is made if the voltage difference between V1, V2, and V3 exceeds 10 volts (default value). If the voltage difference does exceed 10 volts, a determination is made in decision block 2440 if there are current flows in C1, C2, and C3. If there are, then a phase loss alarm is sent to the translation server, and to the customer equipment, if configured, as indicated in block 2450. Processing then returns to the system loop of FIG. 25 as indicated by connector 2460.

In the embodiments described herein, the threshold values that have been used in FIGS. 21-24 and FIGS. 30-33 to determine a deteriorating neutral condition, a leakage current condition, a deteriorating ground condition, and a phase loss condition represent typical initial values. The threshold values can be altered to meet the electrical environment and saved in EEROM.

The various embodiments have been described as a combination of hardware and firmware components. It is important to note, however, that those skilled in the art will appreciate that the software components embedded as firmware in the embodiments described are capable of being distributed as a computer readable storage medium in a variety of forms, and that the invention applies regardless of the particular type of computer readable storage medium utilized to carry out the distribution. Examples of computer readable storage media include, without limitation, recordable-type media such as CompactFlash cards, portable hard drives, diskettes, CD ROMs, memory sticks, and flash drives, as well as EEROM and NVRAM that could be soldered onto a printed circuit board.

The corresponding structures, materials, acts, and equivalents of all means plus function elements in any claims below are intended to include any structure, material, or acts for performing the function in combination with other claim elements as specifically claimed. Those skilled in the art will appreciate that many modifications to the exemplary embodiments are possible without departing from the scope of the present invention.

In addition, it is possible to use some of the features of the embodiments disclosed without the corresponding use of the other features. Accordingly, the foregoing description of the exemplary embodiments is provided for the purpose of illustrating the principles of the invention, and not in limitation thereof, since the scope of the present invention is defined solely by the appended claims.

What is claimed:

1. A method for continuous monitoring of electrical safety conditions and managing of energy consumption in a branch electrical circuit using a microcontroller embedded in a smart circuit breaker, comprising the steps of:
   receiving a plurality of inputs detected by a plurality of sensors in the circuit breaker, including a temperature sensor, a plurality of voltage sensors, and a plurality of current sensors;
   determining, by the microcontroller, an amount of energy consumed during a preset interval of time;
   receiving a temperature of a circuit breaker panel board detected by the temperature sensor, and comparing the temperature with a preset temperature alarm threshold value to determine if the panel board is overheating;
   determining, by the microcontroller, a neutral conductor condition based on a plurality of voltages and currents received from the plurality of voltage and current sensors by comparing a voltage differential with a first preset threshold differential voltage value; and
   transmitting, by the microcontroller, a plurality of data values derived from the plurality of sensor inputs via a secure communications link to a data processing system for storage and presentation to an energy consumer.

2. The method for monitoring and managing of claim 1 further comprising determining, by the microcontroller, if a time base flag is set wherein a time base is obtained from a wide area network or an integrated circuit internal to the microcontroller and is used to clock the preset interval of time.

3. The method for monitoring and managing of claim 1 further comprising determining, by the microcontroller, a leakage current condition based on the plurality of currents received from the plurality of current sensors by comparing a differential current flow with a preset threshold differential current value.

4. The method for monitoring and managing of claim 3 further comprising transmitting a leakage current alarm indication to the data processing system if the differential current flow exceeds the preset threshold differential current value.

5. The method for monitoring and managing of claim 1 further comprising determining, by the microcontroller, a ground system deterioration condition based on a ratio of currents in a ground conductor and the neutral conductor that is compared to a preset threshold differential current ratio value.

6. The method for monitoring and managing of claim 5 further comprising transmitting a ground system deterioration alarm indication to the data processing system if the ratio of currents in the ground conductor and the neutral conductor exceeds the preset threshold differential current ratio value.

7. The method for monitoring and managing of claim 1 further comprising determining, by the microcontroller, a phase loss condition for a three phase system based on the plurality of voltages and currents received from the plurality of voltage and current sensors by comparing the voltage differential with a second preset threshold differential voltage value.

8. The method for monitoring and managing of claim 7 further comprising transmitting a phase loss alarm indication for the three phase system to the data processing system if the voltage differential exceeds the second preset threshold differential voltage value.

9. The method for monitoring and managing of claim 1 further comprising transmitting a temperature alarm indication to the data processing system if the temperature exceeds the preset temperature alarm threshold value.

10. The method for monitoring and managing of claim 1 further comprising transmitting a neutral conductor deterioration alarm indication to the data processing system if the line voltage differential exceeds the first preset threshold differential voltage value.

11. The method for monitoring and managing of claim 1 further comprising embedding a firmware into the microcontroller, the firmware comprising processing logic for monitoring electrical safety conditions and managing energy consumption.

12. The method for monitoring and managing of claim 11 wherein the firmware stores a plurality of preset threshold values for determining a plurality of alarm conditions for the circuit breaker.

13. The method for monitoring and managing of claim 11 further comprising modifying the embedded firmware via a firmware update received by the microcontroller from a File Transfer Protocol (FTP) server.

14. The method for monitoring and managing of claim 1 wherein the communications link uses at least one of an Ethernet protocol, a Bluetooth protocol, a Broadband over Power Line (BPL) protocol, a Power Line Carrier (PLC) protocol, a Worldwide Interoperability for Microwave Access (WiMAX) protocol, a HomePlug protocol, a ZigBee protocol, and a fiber optic cable protocol.

15. The method for monitoring and managing of claim 1 wherein the plurality of data values are transmitted via the secure communications link to at least one of a web-based translation service, a personal computer, or an embedded monitor/controller.

16. The method for monitoring and managing of claim 15 wherein the translation service stores the data values received from the microcontroller and formats the data values for storage on an independent service provider's monitoring service.

17. A system for continuous monitoring of electrical safety conditions and managing of energy consumption in a branch electrical circuit, comprising:
   a smart circuit breaker including an embedded microcontroller, a memory, a plurality of sensors, and a network interface, the microcontroller receiving a plurality of inputs from the plurality of sensors, including a temperature sensor, a plurality of voltage sensors, and a plurality of current sensors;
   a communications link for communicating, via the network interface, a plurality of data values indicative of electrical safety conditions and energy consumption in the branch electrical circuit derived by the microcontroller from the sensor inputs;
   a data processing device for receiving, storing and reformatting the plurality of data values for presentation to a consumer; and a router for receiving the data values communicated over the communications link via the network interface, and transmitting the data values to the data processing device.

18. The system for monitoring and managing of claim 17 wherein the microcontroller memory stores firmware for monitoring electrical safety conditions and managing energy consumption when executed by the microcontroller.

19. The system for monitoring and managing of claim 18 wherein the firmware stores a plurality of preset threshold values for determining a plurality of alarm conditions for the circuit breaker.

20. The system for monitoring and managing of claim 17 wherein the plurality of current sensors comprises a Hall Effect current sensor.

21. The system for monitoring and managing of claim 17 wherein the communications link uses at least one of an Ethernet protocol, a Bluetooth protocol, a Broadband over Power Line (BPL) protocol, a Power Line Carrier (PLC) protocol, a Worldwide Interoperability for Microwave Access (WiMAX) protocol, a HomePlug protocol, a ZigBee protocol, and a fiber optic cable protocol.

22. The system for monitoring and managing of claim 17 wherein the microcontroller determines an amount of energy consumed during a preset interval of time.

23. The system for monitoring and managing of claim 17 wherein the microcontroller receives a temperature of a circuit breaker panel board detected by the temperature sensor, compares the temperature with a preset temperature alarm threshold value to determine if the panel board is overheating, and transmits a temperature alarm indication to the data processing device if the temperature exceeds the preset temperature alarm threshold value.

24. The system for monitoring and managing of claim 17 wherein the microcontroller determines a neutral conductor condition based on a plurality of voltages and currents received from a plurality of voltage and current sensors by comparing the voltage differential with a first preset threshold differential voltage value, and transmits a neutral conductor deterioration alarm indication to the data processing device if the line voltage differential exceeds the first preset threshold differential voltage value.

25. The system for monitoring and managing of claim 17 wherein the microcontroller determines a leakage current condition based on the plurality of currents received from the plurality of current sensors by comparing a differential current flow with a preset threshold differential current value, and transmits a leakage current alarm indication to the data processing device if the differential current flow exceeds the preset threshold differential current value.

26. The system for monitoring and managing of claim 17 wherein the microcontroller determines a ground system deterioration condition based on a ratio of currents in a ground conductor and the neutral conductor by comparing the ratio to a preset threshold differential current ratio value, and transmits a ground system deterioration alarm indication to the data processing device if the ratio of currents in the ground conductor and the neutral conductor exceeds the preset threshold differential current ratio value.

27. The system for monitoring and managing of claim 17 wherein the microcontroller determines a phase loss condition for a three phase system based on the plurality of voltages and currents received from the plurality of voltage and current sensors by comparing the voltage differential with a second preset threshold differential voltage value, and transmits a phase loss alarm indication for the three phase system to the processing device if the voltage differential exceeds the second preset threshold differential voltage value.

28. The system for monitoring and managing of claim 17 further comprising a local area network based appliance in communications with the router and configured to provide local storage of the plurality of data values on at least one memory device.

29. The system for monitoring and managing of claim 17 further comprising a local area network based appliance in communications with the router for hosting an energy management portal.

30. The system for monitoring and managing of claim 29 further comprising a local area network based appliance in communications with the router for hosting a secure web server to enable remote users to authenticate and communicate with the energy management portal via a wide area network.

31. The system for monitoring and managing of claim 29 wherein the local area network based appliance comprises a software module enabling the appliance to function as a control gateway.

32. The system for monitoring and managing of claim 31 further comprising an electrical device including a power control element for enabling remote control via the local area network based appliance.

33. The system for monitoring and managing of claim 32 wherein the power control element comprises at least one of an electromechanical enable/disable switch, a push/pull operator, a rotary operator, and a removable pin operator.

34. The system for monitoring and managing of claim 32 wherein the power control element is linked to a color-coded warning indicator to signify a remote control enablement condition.

35. A smart circuit breaker for a branch electrical circuit, comprising:
   an embedded microcontroller, with firmware stored in a memory, for continuously determining a plurality of energy consumption and electrical safety conditions for the electrical circuit;
   a temperature sensor for detecting a temperature associated with the circuit breaker, and inputting the temperature to the microcontroller for determination of a circuit breaker panel overheating condition;
   a plurality of voltage sensors for detecting a voltage associated with each of a plurality of conductors in the circuit breaker, and inputting the plurality of voltages to the microcontroller for determination of a neutral conductor deterioration condition;
   a plurality of current sensors for detecting a current flow through each of the plurality of conductors, and inputting the plurality of current flows to the microcontroller for determination of a leakage current condition;
   a network interface for communicating a plurality of data values, indicative of the energy consumption and electrical safety conditions in the branch electrical circuit determined by the firmware stored in the microcontroller from the sensor temperature, voltage, and current inputs, to a data processing system over a communications network.

36. The circuit breaker for an electrical circuit of claim 35 wherein the temperature sensor comprises a thermistor.

37. The circuit breaker for an electrical circuit of claim 35 wherein the temperature sensor comprises an integrated circuit sensor.

38. The circuit breaker for an electrical circuit of claim 35 wherein the current sensors include at least one Hall Effect current sensor for detecting current in the neutral conductor.

39. The circuit breaker for an electrical circuit of claim 35 wherein the current sensors include at least one Hall Effect current sensor for detecting current in a building ground system.

40. The circuit breaker for an electrical circuit of claim 35 wherein the network interface is a HomePlug network interface.

41. The circuit breaker for an electrical circuit of claim 35 wherein the microcontroller determines a ground system deterioration condition based on a ratio of currents in a ground conductor and a neutral conductor by comparing the ratio to a preset threshold differential current ratio value, and transmits a ground system deterioration alarm indication to the data processing system if the ratio of currents in the ground conductor and the neutral conductor exceeds the preset threshold differential current ratio value.

42. The circuit breaker for an electrical circuit of claim 35 wherein the microcontroller determines a phase loss condition for a three phase system based on the plurality of voltages and currents received from the plurality of voltage and current sensors by comparing a voltage differential with a preset threshold differential voltage value, and transmits a phase loss alarm indication for the three phase system to the processing device if the voltage differential exceeds the preset threshold differential voltage value.

* * * * *